United States Patent
Lee et al.

(10) Patent No.: US 9,496,218 B2
(45) Date of Patent: *Nov. 15, 2016

(54) INTEGRATED CIRCUIT DEVICE HAVING THROUGH-SILICON-VIA STRUCTURE

(71) Applicant: Samsung Electronics Co., Ltd., Suwon-si, Gyeonggi-do (KR)

(72) Inventors: Do-Sun Lee, Gwangju (KR); Kun-Sang Park, Hwaseong-si (KR); (Continued)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/919,580

(22) Filed: Jun. 17, 2013

(65) Prior Publication Data

US 2014/0021633 A1 Jan. 23, 2014

(30) Foreign Application Priority Data

Jul. 17, 2012 (KR) .................. 10-2012-0077920

(51) Int. Cl.
*H01L 23/522* (2006.01)
*H01L 23/48* (2006.01)
(Continued)

(52) U.S. Cl.
CPC ....... *H01L 23/5226* (2013.01); *H01L 21/2885* (2013.01); *H01L 21/76898* (2013.01); (Continued)

(58) Field of Classification Search
CPC ................. C23C 18/2086; C23C 18/30; H01L 21/76898; H01L 23/49827; H01L (Continued)

(56) References Cited

U.S. PATENT DOCUMENTS 6,150,697 A * 11/2000 Teshigahara ...... H01L 21/76264
257/335
6,921,718 B2 * 7/2005 Andoh .............. H01L 21/76898
257/E21.597
(Continued)

FOREIGN PATENT DOCUMENTS

JP 2007005404 1/2007
JP 2010-027300 2/2010
(Continued)

OTHER PUBLICATIONS

J Thibault et al. (2000, pp. 379-451) Grain Boundaries in Semiconductors, in Handbook of Semiconductor Technology: Electronic Structure and Properties of Semiconductors, vol. 1 (eds K. A. Jackson and W. Schröter), Wiley-VCH Verlag GmbH, Weinheim, Germany. doi: 10.1002/9783527621842.ch7.*
(Continued)

*Primary Examiner* — Jerome Jackson, Jr.
*Assistant Examiner* — Fang-Xing Jiang
(74) *Attorney, Agent, or Firm* — Myers Bigel & Sibley, P.A.

(57) ABSTRACT

An integrated circuit device including a through-silicon-via (TSV) structure and methods of manufacturing the same are provided. The integrated circuit device may include the TSV structure penetrating through a semiconductor structure. The TSV structure may include a first through electrode unit including impurities of a first concentration and a second through electrode unit including impurities of a second concentration greater than the first concentration.

30 Claims, 20 Drawing Sheets

(72) Inventors: Byung-Lyul Park, Seoul (KR);
Seong-min Son, Hwaseong-si (KR);
Gil-heyun Choi, Seoul (KR)

(51) Int. Cl.
*H01L 21/768* (2006.01)
*H01L 21/288* (2006.01)
*H01L 23/498* (2006.01)
*H01L 23/31* (2006.01)
*H01L 25/065* (2006.01)

(52) U.S. Cl.
CPC ......... *H01L 23/481* (2013.01); *H01L 23/3128* (2013.01); *H01L 23/49827* (2013.01); *H01L 25/0657* (2013.01); *H01L 2224/0401* (2013.01); *H01L 2224/05* (2013.01); *H01L 2224/05009* (2013.01); *H01L 2224/06181* (2013.01); *H01L 2224/13* (2013.01); *H01L 2224/16146* (2013.01); *H01L 2224/73104* (2013.01); *H01L 2924/13091* (2013.01); *H01L 2924/1461* (2013.01)

(58) Field of Classification Search
CPC ............... 21/76264;H01L 29/66386; H05K 3/423; H05K 2201/09563
See application file for complete search history.

(56) References Cited

U.S. PATENT DOCUMENTS

| | | | |
|---|---|---|---|
| 7,229,916 | B2 | 6/2007 | Kitao et al. |
| 7,528,006 | B2 | 5/2009 | Arana et al. |
| 7,834,461 | B2 * | 11/2010 | Asai ................. H01L 21/76898 257/751 |
| 2009/0315154 | A1 * | 12/2009 | Kirby et al. ................. 257/621 |
| 2011/0062594 | A1 * | 3/2011 | Maekawa ............. H01L 21/486 257/774 |
| 2011/0136338 | A1 | 6/2011 | Park et al. |
| 2013/0118784 | A1 * | 5/2013 | Uzoh ................. H01L 23/49827 174/257 |
| 2013/0320395 | A1 * | 12/2013 | Menard ............. H01L 29/66386 257/107 |
| 2014/0084473 | A1 * | 3/2014 | Moon ............. H01L 21/76877 257/751 |

FOREIGN PATENT DOCUMENTS

| | | |
|---|---|---|
| KR | 10-0705950 | 6/2003 |
| KR | 1020070031541 A | 3/2007 |
| KR | 10-1083042 | 12/2010 |
| KR | 1020110064828 A | 6/2011 |

OTHER PUBLICATIONS

Jinggang Lu et al. Effects of grain boundary on impurity gettering and oxygen precipitation in polycrystalline sheet silicon (Journal of Applied Physics, vol. 94, No. 1, pp. 140~144, Jul. 1, 2003).*

T. Buonassisi et al. "Metal precipitation at grain boundaries in silicon: Dependence on grain boundary character and dislocation decoration", (Applied Physics Letters 89, 042102,2006).*

Min-Seung Yoon et al. "Impurity redistributions in electroplated Cu films during self-annealing" *Thin Solid Films*,408, pp. 230-235 (2002).

Chukwudi Okoro et al. "Impact of the electrodeposition chemistry used for TSV filling on the microstructural and thermo-mechanical response of Cu" *J Mater Sci*, pp. 1-15, published online: Feb. 1, 2011.

James J. Kelly et al. "Leveling and Microstructural Effects of Additives for Copper Electrodeposition" *Journal of the Electrochemical Society*, 146(7), pp. 2540-2545 (1999).

* cited by examiner

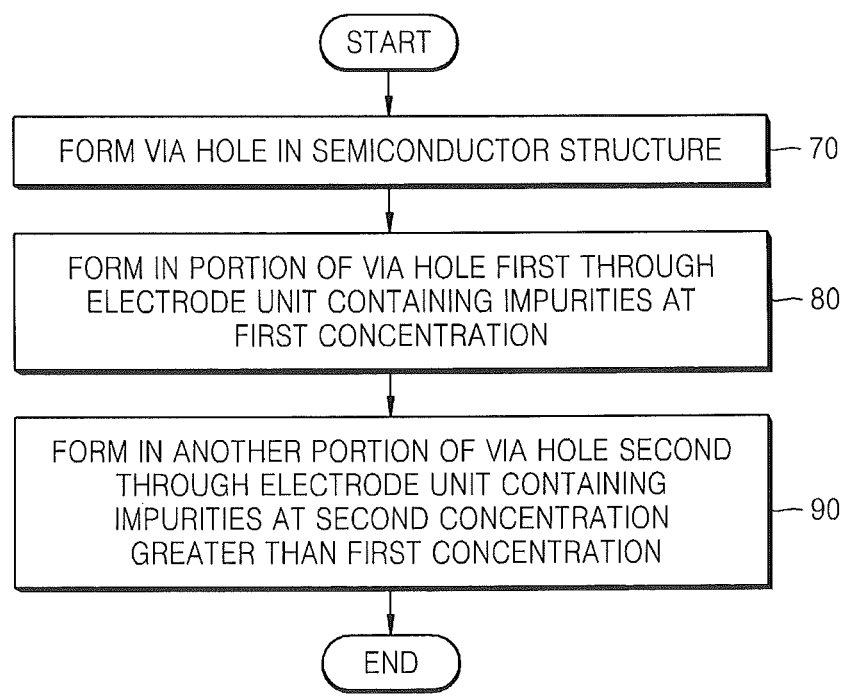

INTEGRATED CIRCUIT DEVICE HAVING THROUGH-SILICON-VIA STRUCTURE

CROSS-REFERENCE TO RELATED APPLICATIONS

This U.S. non-provisional application claims priority under 35 U.S.C. §119 to Korean Patent Application No. 10-2012-0077920, filed on Jul. 17, 2012, in the Korean Intellectual Property Office, the disclosure of which is hereby incorporated by reference in its entirety.

FIELD

The present disclosure generally relates to the field of electronics, and more particularly semiconductor devices.

BACKGROUND

As integrated circuit devices have been highly integrated, three-dimensional packaging technologies for stacking chips have been developed. A through silicon via (TSV) technology is a three-dimensional packaging technology in which a via hole is formed through a silicon substrate and a via structure is formed therein.

SUMMARY

An integrated circuit device may include a semiconductor structure and a through-silicon-via (TSV) structure penetrating through the semiconductor structure. The TSV structure may include a first through electrode unit comprising a first surface of the TSV structure and including impurities of a first concentration and a second through electrode unit comprising a second surface of the TSV structure and including impurities of a second concentration greater than the first concentration. The second surface is opposite the first surface.

According to various embodiments, the first and second through electrode units may include a metal.

According to various embodiments, the second concentration may be at least ten times greater than the first concentration.

In various embodiments, the second through electrode unit may include a number of sub-microvoids or twin boundaries greater than that of sub-microvoids or twin boundaries the first through electrode unit includes.

According to various embodiments, the first through electrode unit may include a first metal layer having a first average grain size and the second through electrode unit may include a second metal layer having a second average grain size less than the first average grain size.

In various embodiments, each of the first and second through electrode units may include a first metal or an alloy of the first metal, a second metal and at least one impurity of carbon (C), oxygen (O), nitrogen (N), sulfur (S) and a halogen group element.

According to various embodiments, the second through electrode unit may include impurities including an amino or aromatic functional group.

In various embodiments, the semiconductor structure may include a substrate and an interlayer insulating layer on the substrate. A sidewall of the first through electrode unit may be surrounded by the substrate and a sidewall of the second through electrode unit may be surrounded by the interlayer insulating layer. An interface between the first and second through electrode units may extend at a portion of the TSV structure surrounded by the interlayer insulating layer.

In various embodiments, the semiconductor structure may include a substrate and an interlayer insulating layer covering the substrate. A sidewall of the first through electrode unit may be surrounded by the interlayer insulating layer and a sidewall of the second through electrode unit may be surrounded by the substrate. An interface between the first and second through electrode units may extend at a portion of the TSV structure surrounded by the substrate.

According to various embodiments, the semiconductor structure may include a substrate, an interlayer insulating layer on the substrate and an inter-metal-layer insulating layer on the interlayer insulating layer. The TSV structure may penetrate through the substrate, the interlayer insulating layer, and the inter-metal-layer insulating layer. A sidewall of the first through electrode unit may be surrounded by the substrate and the interlayer insulating layer and a sidewall of the second through electrode unit may be surrounded by the inter-metal-layer insulating layer. An interface between the first and second through electrode units may extend at a portion of the TSV structure surrounded by the inter-metal-layer insulating layer.

An integrated circuit device may include a package substrate including connection terminals and at least one semiconductor chip on the package substrate. The at least one semiconductor chip may include a substrate, an interlayer insulating layer on the substrate and a through-silicon-via (TSV) structure penetrating through the substrate and the interlayer insulating layer. The TSV structure may include a first through electrode unit, which includes a first surface of the TSV structure and includes impurities of a first concentration, and a second through electrode unit, which includes a second surface of the TSV structure opposite the first surface and includes impurities of a second concentration greater than the first concentration.

In various embodiments, the first through electrode unit including a first metal layer having a first average grain size in range of about 100 nm to about 3 μm and the second through electrode unit including a second metal layer having a second average grain size less than the first average grain size.

A method of manufacturing an integrated circuit device may include forming a via hole in a semiconductor structure. The method may further include forming a first through electrode unit including impurities of a first concentration and filling a portion of the via hole. The method may also include forming a second through electrode unit including impurities of a second concentration greater than the first concentration and filling a portion of the via hole.

According to various embodiments, forming the first through electrode unit may include forming a first conductive layer by applying a current having a first current density to the semiconductor structure and forming the second through electrode unit may include forming a second conductive layer by applying a current having a second current density greater than the first current density to the semiconductor structure.

According to various embodiments, forming the first through electrode unit may include forming a first conductive layer having a first average grain size and forming the second through electrode unit may include forming a second conductive layer having a second average grain size less than the first average grain size.

A method of manufacturing an integrated circuit device may include forming an interlayer insulating layer on a substrate, forming a via hole penetrating the interlayer insulating layer; and forming a through-silicon-via (TSV) structure in the via hole. Forming the TSV structure may include forming a first through electrode unit including impurities of a first concentration in a portion of the via hole near a bottom portion of the via hole and forming a second through electrode unit including impurities of a second concentration greater than the first concentration in a portion of the via hole near a top portion of the via hole.

According to various embodiments, forming the TSV structure may further include forming a conductive layer on the substrate by an electroplating process using a plating composition including a leveling agent including an amino or aromatic functional group.

In various embodiments, forming the second through electrode unit may include incorporating the leveling agent or a by-product of the leveling agent into the conductive layer.

In various embodiments, forming the first through electrode unit may include forming a first conductive layer by applying a current having a first current density to the substrate. Forming the second through electrode unit may include forming a second conductive layer by applying a current having a second current density greater than the first current density to the substrate.

In various embodiments, the first current density may be in range of about 0.1 mA/cm$^2$ to about 5 mA/cm$^2$ and the second current density may be in range of about 5 mA/cm$^2$ to about 100 mA/cm$^2$.

A method of manufacturing an integrated circuit device may include forming a via hole in a semiconductor structure and forming a through-silicon-via (TSV) structure in the via hole by applying a current having a current density selected within a range of about 5 to about 100 mA/cm$^2$ to the semiconductor structure. The TSV structure may include a conductive layer including impurities.

An integrated circuit device may include a substrate and a via hole penetrating through the substrate. The device may further include a via electrode within the via hole. The via electrode may include a first electrode and a second electrode with a boundary therebetween and a first average grain size of a first conductive material included in the first electrode may be greater than a second average grain size of a second conductive material included in the second electrode.

According to various embodiments, the first electrode may include a first surface of the via electrode and the second electrode may include a second surface of the via electrode, which is opposite the first surface.

According to various embodiments, the second average grain size may be equal to or less than about 100 nm.

In various embodiments, the first average grain size may be in range of about 100 nm to about 3 μm.

In various embodiments, a ratio of the first average grain size to the second average grain size may be in range of about 1.5 to about 10.

According to various embodiments, the first conductive material may include first impurities of a first concentration and the second conductive material may include second impurities of a second concentration greater than the first concentration.

According to various embodiments, the second concentration may be at least ten times greater than the first concentration.

In various embodiments, a cross-sectional area of the first electrode may be greater than a cross-sectional area of the second electrode.

According to various embodiments, a height of the second electrode when viewed in cross section may be in range of about 1 μm to about 10 μm.

BRIEF DESCRIPTION OF THE DRAWINGS

FIG. 2 is a flowchart of a method of manufacturing an integrated circuit device according to some embodiments of the inventive concept;

DETAILED DESCRIPTION

Figure 1A:
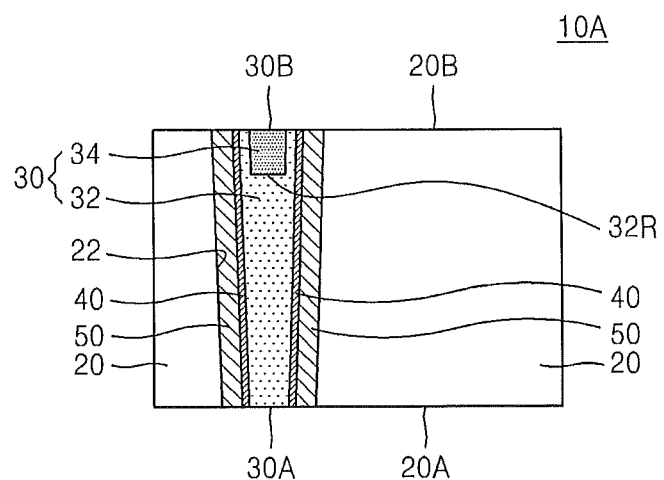
FIG. 1A is a cross-sectional view of an integrated circuit device according to some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1A is a cross-sectional view of an integrated circuit device 10A according to some embodiments of the inventive concept.

Referring to FIG. 1A, the integrated circuit device 10A includes a semiconductor structure 20, and a through-silicon-via (TSV) structure 30 that penetrates through the semiconductor structure 20.

As appreciated by the present inventors, the TSV structure 30 may be extruded from or separated from the semiconductor structure 20 because the TSV structure 30 and the semiconductor structure 20 have different coefficients of thermal expansion.

The TSV structure 30 includes first and second through electrode units 32 and 34 connected integrally to each other. The first through electrode unit 32 has a top surface in which a recess 32R is formed, and the second through electrode unit 34 is accommodated in the recess 32R. A side wall of the second through electrode unit 34 is surrounded by the first through electrode unit 32.

In some embodiments, the semiconductor structure 20 may be formed as a semiconductor substrate, e.g., a silicon substrate. In this case, the first and second through electrode units 32 and 34 of the TSV structure 30 may have side walls surrounded by the semiconductor substrate.

In some embodiments, the semiconductor structure 20 may include a semiconductor substrate, and an interlayer insulating layer for covering the semiconductor substrate. In this case, the first through electrode unit 32 may have a side wall surrounded by the semiconductor substrate, and the second through electrode unit 34 may have a side wall surrounded by the interlayer insulating layer.

In some embodiments, the semiconductor structure 20 may include a semiconductor substrate, an interlayer insulating layer for covering the semiconductor substrate, and an inter-metal-layer insulating layer for covering the interlayer insulating layer. In this case, the first through electrode unit 32 may have a side wall surrounded by the semiconductor substrate and the interlayer insulating layer, and the second through electrode unit 34 may have a side wall surrounded by the inter-metal-layer insulating layer.

The first through electrode unit 32 is exposed at one end 30A of the TSV structure 30 near a first surface 20A of the semiconductor structure 20. The second through electrode unit 34 is exposed at another end 30B of the TSV structure 30 near a second surface 20B of the semiconductor structure 20 opposite to the first surface 20A.

In some embodiments, a first conductive layer for forming the first through electrode unit 32 and a second conductive layer for forming the second through electrode unit 34 may be formed of the same metal. In some embodiments, the first conductive layer for forming the first through electrode unit 32 and the second conductive layer for forming the second through electrode unit 34 may be formed of different metals. For example, each of the first and second through electrode units 32 and 34 may be formed of copper (Cu), copper tin (CuSn), copper magnesium (CuMg), copper nickel (CuNi), copper zinc (CuZn), copper palladium (CuPd), copper gold (CuAu), copper rhenium (CuRe), copper tungsten (CuW), tungsten (W), or an alloy of W.

The first through electrode unit 32 contains impurities at a first concentration, and the second through electrode unit 34 contains impurities at a second concentration that is greater than the first concentration. In some embodiments, an impurity concentration in the second through electrode unit 34 is at least ten times greater than that in the first through electrode unit 32. For example, the impurity concentration in the second through electrode unit 34 may be several ten to several ten thousand times greater than that in the first through electrode unit 32.

In some embodiments, each of the first and second through electrode units 32 and 34 may contain at least one impurity selected from the group consisting of carbon (C), oxygen (O), nitrogen (N), sulfur (S), a halogen group element, an aromatic hydrocarbon compound, an aliphatic hydrocarbon compound, and metal. In some embodiments, the second through electrode unit 34 may include impurities including a leveling agent or its by-product. For example, the second through electrode unit 34 may include the impurities including an amino or aromatic functional group. The amino or aromatic functional group may be derived from additives or their by-products, which are included in a plating composition used in an electroplating process for forming the first and second through electrode units 32 and 34. In some embodiments, due to a large aspect ratio of a via hole 22 formed in the semiconductor structure 20, the additives, and more particularly, the leveling agent, or their by-products, which are included in the second through electrode unit 34, may have a relatively high content in comparison to that included in the first through electrode unit 32. Detailed descriptions thereof will be provided below with reference to FIGS. 5 and 7.

In some embodiments, the first through electrode unit 32 may include impurities at about 0.001 to 10 ppm. The second through electrode unit 34 may include the impurities at about 1 to 10,000 ppm.

Since the first through electrode unit 32 includes the impurities at a relatively low concentration, growing of metal grains and thermal stress relaxation during when the first through electrode unit 32 is formed may be achieved relatively freely. Thus, metal grains having a relatively large average grain size may be obtained, and a possibility that the impurities are trapped or microvoids having a size of several to several hundred μm are formed, or sub-microvoids having a size of several to several hundred nm are formed at grain boundaries of the metal grains is relatively low. Accordingly, extrusion of the first through electrode unit 32 from the via hole 22 may be reduced.

During when the second through electrode unit 34 is formed, the impurities included in the second through electrode unit 34 at a relatively high concentration may be trapped. The impurities may influence thermo-mechanical behavior of a metal layer formed by using an electroplating process so as to form the second through electrode unit 34, and may suppress growing and recrystallization of metal grains. The impurities having a relatively high concentration in the second through electrode unit 34 may be distributed along grain boundaries of the metal grains for forming the second through electrode unit 34 due to the Zener pinning effect, so as to pin the grain boundaries and suppress free motion of one-dimensional dislocation, and to restrict stress relaxation. Accordingly, due to stress hysteresis, an elastic deformation region may be large and irreversible deformation (plastic deformation) of the second through electrode unit 34 may be restricted. Also, a relatively large number of stress relaxation components may exist in the second through electrode unit 34. For example, growing of metal grains having a relatively small grain size may be used as a stress relaxation component in the second through electrode unit 34. Alternatively, a larger number of sub-microvoids having a size of several to several hundred nm, e.g., a size equal to or less than 100 nm, exist in the second through electrode unit 34 in comparison to the first through electrode unit 32, and the sub-microvoids may be used as another stress relaxation component. Accordingly, although a thermal budget is caused by, for example, annealing, undesired local extrusion of the second through electrode unit 34 may be reduced and a stable structure and an improved reliability may be provided. As described above, since the impurities having a relatively high concentration and trapped in the second through electrode unit 34 may suppress growing of the metal grains during when the second through electrode unit 34 is formed, a relatively small average grain size may be obtained in comparison to that of the metal grains of the first through electrode unit 32.

In some embodiments, a larger number of sub-microvoids are formed in the second through electrode unit 34 in comparison to the first through electrode unit 32. A plurality of sub-microvoids are formed in the second through electrode unit 34 during when the second through electrode unit 34 is formed. Due to the structural stability of twin boundaries in the second through electrode unit 34, the sub-microvoids may be formed when growing of the metal grains is suppressed in an annealing process for forming the second through electrode unit 34.

In some embodiments, the first through electrode unit 32 may be formed as a first metal layer having a first average grain size, and the second through electrode unit 34 may be formed as a second metal layer having a second average grain size less than the first average grain size. Since the second through electrode unit 34 includes the impurities at a higher content in comparison to the first through electrode unit 32, after an electroplating process and an annealing process for forming the first and second through electrode units 32 and 34 are performed, growing of the metal grains in the second through electrode unit 34 is suppressed due to the impurities that exist at boundaries between the metal grains. Accordingly, the metal grains for forming the second through electrode unit 34 may have an average size less than that of the metal grains for forming the first through electrode unit 32.

As illustrated in FIG. 1A, the integrated circuit device 10A further includes a barrier layer 40 that extends in the via hole 22 to penetrate through the semiconductor structure 20. The barrier layer 40 surrounds the first and second through electrode units 32 and 34 of the TSV structure 30. The barrier layer 40 may include at least one material selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB).

An insulating layer 50 is formed between the semiconductor structure 20 and the barrier layer 40. The insulating layer 50 may be formed as an oxide layer, a nitride layer, a carbide layer, or a combination thereof.

Although the TSV structure 30 includes the first and second through electrode units 32 and 34 in FIG. 1A, the inventive concept is not limited thereto. For example, an integrated circuit device including a TSV structure including a through electrode unit formed with a single layer structure having the same composition and features as the second through electrode unit 34 may also be included in the scope of the inventive concept.

Figure 1B:
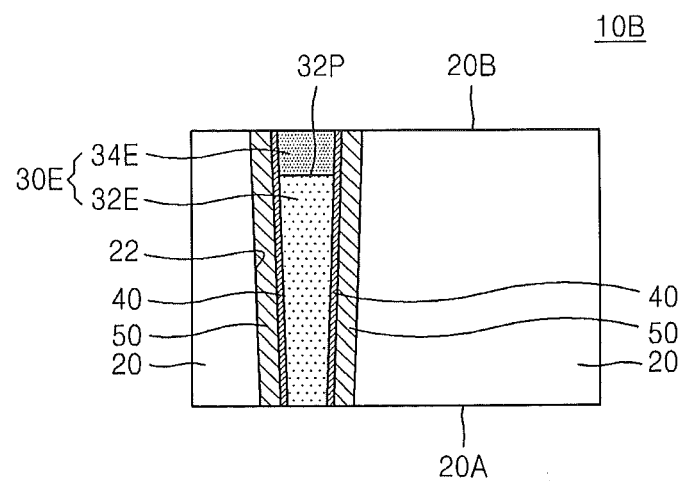
FIG. 1B is a cross-sectional view of an integrated circuit device according to some embodiments of the inventive concept.

FIG. 1B is a cross-sectional view of an integrated circuit device 10B according to some embodiments of the inventive concept.

Referring to FIG. 1B, the integrated circuit device 10B includes a TSV structure 30E that penetrates through the semiconductor structure 20.

The TSV structure 30E includes first and second through electrode units 32E and 34E connected integrally to each other. The first and second through electrode units 32E and 34E are similar to the first and second through electrode units 32 and 34 illustrated in FIG. 1A. However, the first through electrode unit 32E has a planar top surface 32P. The second through electrode unit 34E is formed on the planar top surface 32P. A side wall of the second through electrode unit 34 contacts the barrier layer 40.

FIG. 2 is a flowchart of a method of manufacturing an integrated circuit device, according to some embodiments of the inventive concept.

Referring to FIGS. 1A, 1B, and 2, in operation 70, the via hole 22 is formed in the semiconductor structure 20.

In operation 80, the first through electrode unit 32 or 32E containing impurities at a first concentration is formed in a portion of the via hole 22.

In operation 90, the second through electrode unit 34 or 34E containing impurities at a second concentration greater than the first concentration is formed in the other portion of the via hole 22.

Figure 3A:
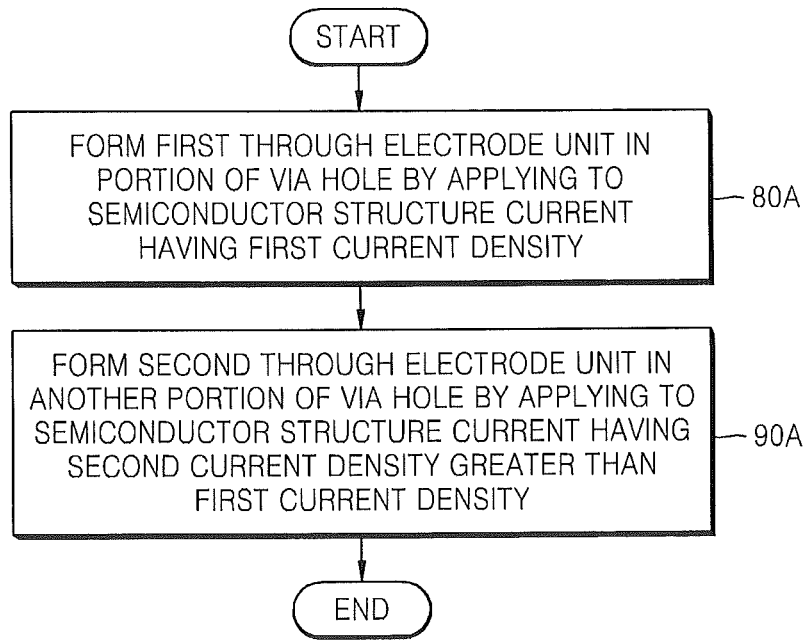
FIG. 3A is a flowchart of operations of forming first and second through electrode units in the method illustrated in FIG. 2 according to some embodiments of the inventive concept.

FIG. 3A is a flowchart of operations of forming the first and second through electrode units 32 or 32E and 34 or 34E in the method illustrated in FIG. 2, according to some embodiments of the inventive concept.

Referring to FIGS. 1A, 1B, and 3A, in operation 80A, the first through electrode unit 32 or 32E is formed in a portion of the via hole 22 by applying to the semiconductor structure 20 a current having a first current density.

In operation 90A, the second through electrode unit 34 or 34E is formed in the other portion of the via hole 22 by applying to the semiconductor structure 20 a current having a second current density greater than the first current density.

Figure 3B:
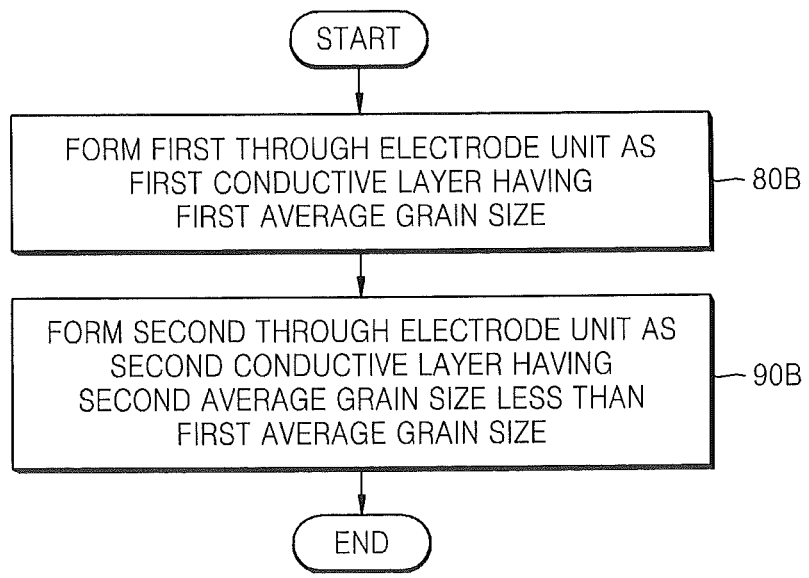
FIG. 3B is a flowchart of operations of forming first and second through electrode units in the method illustrated in FIG. 2 according to some embodiments of the inventive concept.

FIG. 3B is a flowchart of operations of forming first and second through electrode units 32 or 32E and 34 or 34E in the method illustrated in FIG. 2, according to some embodiments of the inventive concept.

Referring to FIGS. 1A, 1B, and 3B, in operation 80B, the first through electrode unit 32 or 32E is formed as a first conductive layer having a first average grain size.

In operation 90B, the second through electrode unit 34 or 34E is formed as a second conductive layer having a second average grain size less than the first average grain size.

The integrated circuit device 10A or 10B illustrated in FIG. 1A or 1B, and the method illustrated in FIG. 2, 3A, or 3B will now be described in detail.

FIGS. 4A through 4M are cross-sectional views for describing a method of manufacturing an integrated circuit device 100 (see FIG. 4M), according to some embodiments of the inventive concept.

Figure 4A:
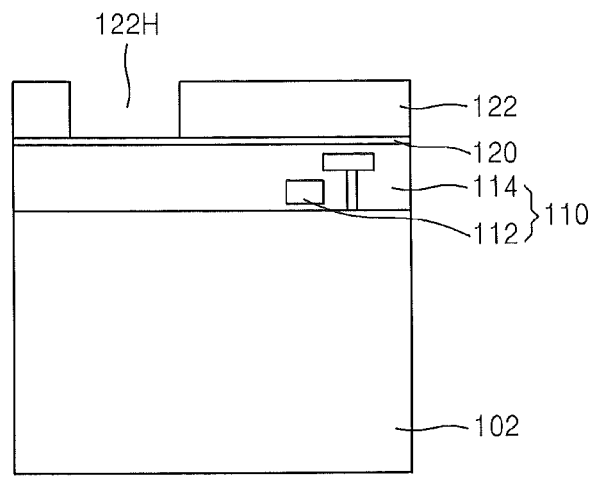
FIGS. 4A through 4M are cross-sectional views illustrating a method of manufacturing an integrated circuit device according to some embodiments of the inventive concept.

Referring to FIG. 4A, a front-end-of-line (FEOL) structure 110 is formed on a substrate 102, a polishing stopper 120 is formed on the FEOL structure 110, and then a mask pattern 122 is formed on the polishing stopper 120. A hole 122H for partially exposing a top surface of the polishing stopper 120 is formed in the mask pattern 122.

In some embodiments, the substrate 102 is a semiconductor wafer. In some embodiments, the substrate 102 includes silicon (Si). In some embodiments, the substrate 102 may include a semiconductor element such as germanium (Ge), or a compound semiconductor such as silicon carbide (SiC), gallium arsenide (GaAs), indium arsenide (InAs), or indium phosphide (InP). In some embodiments, the substrate 102 may have a silicon on insulator (SOI) structure. For example, the substrate 102 may include a buried oxide layer (BOX). In some embodiments, the substrate 102 may include a conductive region, e.g., a well doped with impurities, or a structure doped with impurities. Also, the substrate 102 may include various isolation structures such as a shallow trench isolation (STI) structure.

The FEOL structure 110 includes a plurality of individual devices 112 and an interlayer insulating layer 114. The individual devices 112 may include various microelectronic devices, e.g., a metal-oxide-semiconductor field effect transistor (MOSFET) such as a complementary metal-oxide-semiconductor (CMOS) transistor, an image sensor such as a large scale integration (LSI) system or a CMOS imaging sensor (CIS), a micro-electro-mechanical system (MEMS), an active device, and a passive device. The individual devices 112 may be electrically connected to the conductive region of the substrate 102. Also, the individual devices 112 may be electrically insulated from adjacent individual devices by the interlayer insulating layer 114.

In some embodiments, the polishing stopper 120 may be formed as a silicon nitride layer. The polishing stopper 120 may have a thickness in range of about 200 to about 1000 Å. The polishing stopper 120 may be formed by using a chemical vapor deposition (CVD) process.

The mask pattern 122 may be formed of a photoresist material.

Figure 4B:
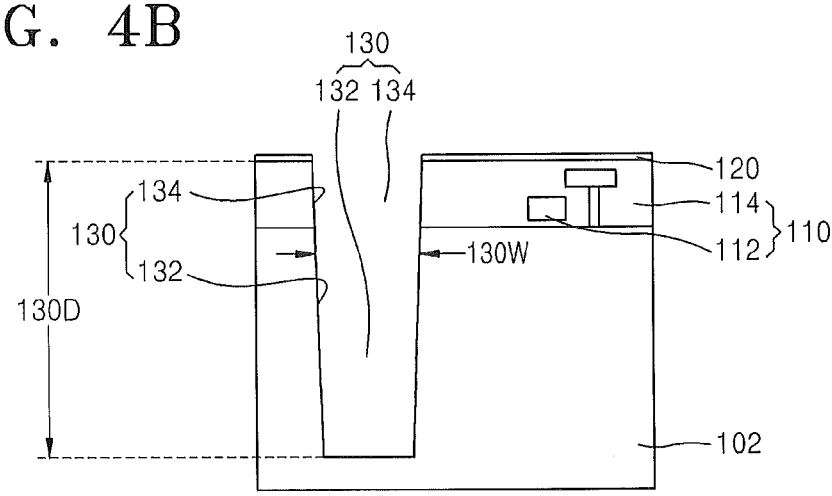

Referring to FIG. 4B, a via hole 130 is formed by etching the polishing stopper 120 and the interlayer insulating layer 114, and then etching the substrate 102, by using the mask pattern 122 (see FIG. 4A) as an etching mask. The via hole 130 includes a first hole 132 formed in the substrate 102 to a predetermined depth, and a second hole 134 formed to penetrate through the interlayer insulating layer 114 and connected to the first hole 132.

The via hole 130 may be formed by using an anisotropic etching process or a laser drilling process. In some embodiments, the via hole 130 may have a width 130W equal to or less than about 10 μm in the substrate 102. In some embodiments, the via hole 130 may have a depth 130D in range of about 50 to about 100 μm from a top surface of the interlayer insulating layer 114. However, the via hole 130 is not limited to the above-mentioned width 130W and the depth 130D and may have various sizes according to necessity. The first hole 132 of the via hole 130 exposes the substrate 102, and the second hole 134 of the via hole 130 exposes the interlayer insulating layer 114.

After the via hole 130 is formed, the mask pattern 122 may be removed to expose the top surface of the polishing stopper 120.

Figure 4C:
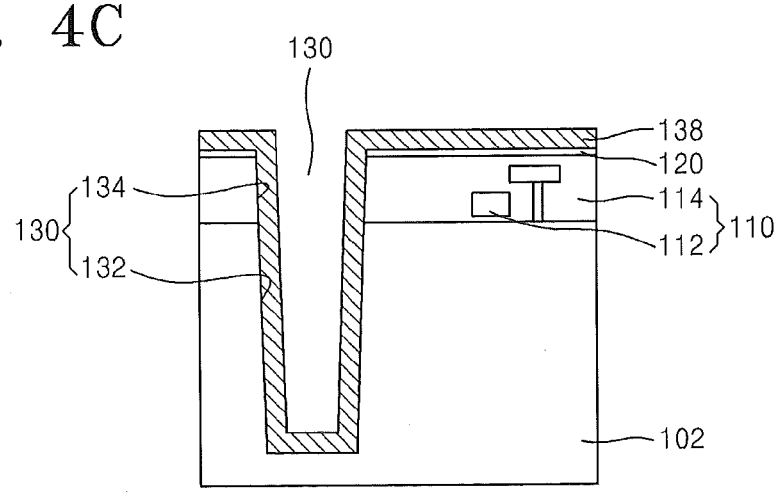

Referring to FIG. 4C, an insulating layer 138 is formed to cover an inner side wall and a bottom surface of the via hole 130.

The insulating layer 138 may uniformly cover a surface of the substrate 102 exposed by the via hole 130, a surface of the interlayer insulating layer 114, and a surface of the polishing stopper 120. In some embodiments, the insulating layer 138 may be formed as an oxide layer, a nitride layer, a carbide layer, or a combination thereof. In some embodiments, the insulating layer 138 may be formed by using a CVD process. The insulating layer 138 may have a thickness of about 1500 to 2500 Å.

Figure 4D:
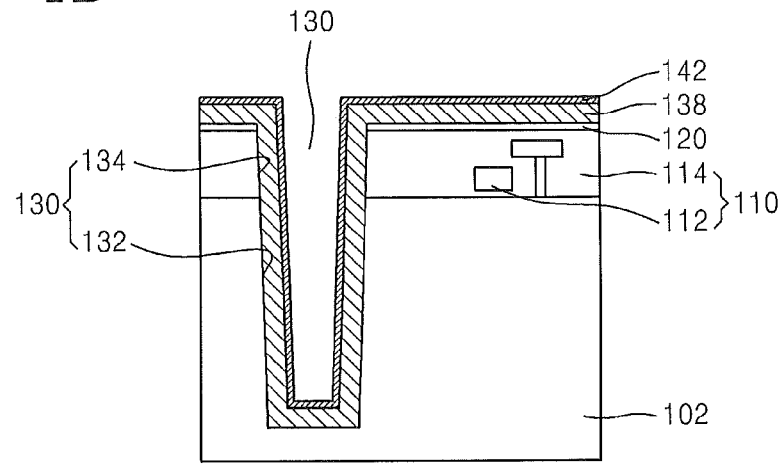

Referring to FIG. 4D, a barrier layer 142 is formed on the insulating layer 138.

The barrier layer 142 extends to cover a bottom surface and a side wall of the first hole 132, a side wall of the second hole 134, and a top surface of the insulating layer 138. In some embodiments, the barrier layer 142 may include at least one material selected from the group consisting of Ti, TiN, Ta, TaN, Ru, Co, Mn, WN, Ni, and NiB. In some embodiments, the barrier layer 142 may be formed by using a physical vapor deposition (PVD) process, a CVD process, or an atomic layer deposition (ALD) process. In some embodiments, the barrier layer 142 may have different thicknesses. For example, the barrier layer 142 may have different thicknesses outside and inside the via hole 130. For example, outside the via hole 130, the barrier layer 142 may have a thickness in range of about 1000 to about 2000 Å on the top surface of the insulating layer 138. Inside the via hole 130, the barrier layer 142 may have a thickness in range of about 40 to about 50 Å on the top surface of the insulating layer 138.

Figure 4E:
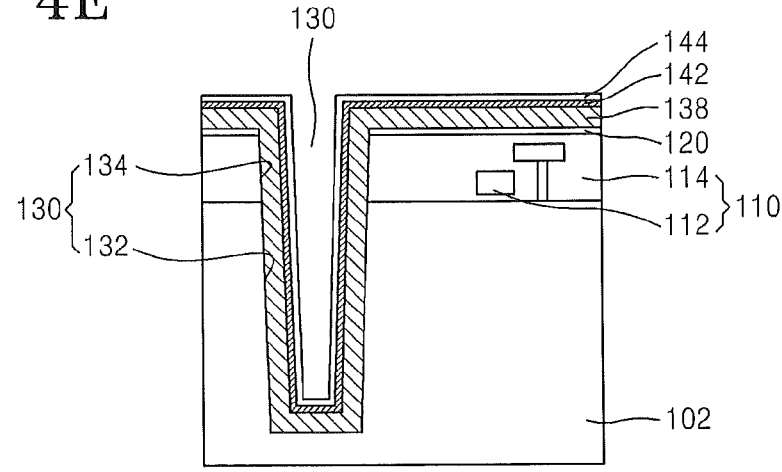

Referring to FIG. 4E, a metal seed layer 144 is formed on a surface of the barrier layer 142.

In some embodiments, the metal seed layer 144 may be formed of Cu, an alloy of Cu, Co, Ni, Ru, Co/Cu, or Ru/Cu. The metal seed layer 144 may be formed by using a PVD process.

Figure 4F:
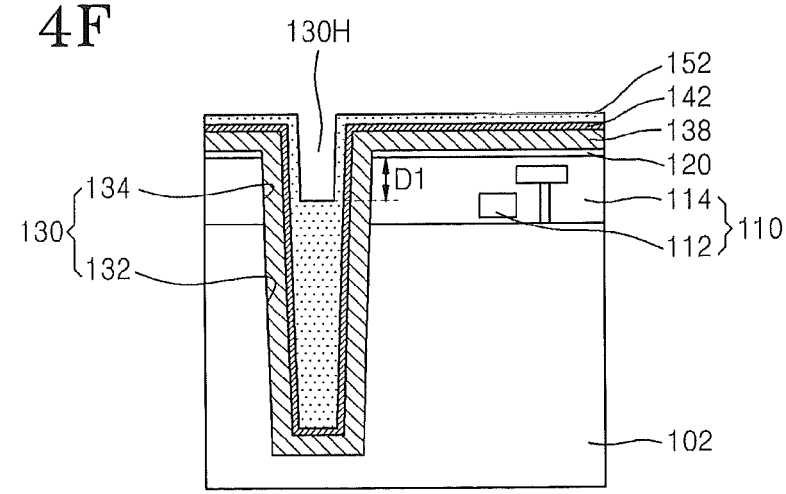

Referring to FIG. 4F, a first electroplating process is performed to grow a metal layer from the metal seed layer 144 (see FIG. 4E). In more detail, a first conductive layer 152 filling a portion of the via hole 130 is formed on the barrier layer 142 by performing the first electroplating process.

In the first electroplating process, the first conductive layer 152 fills only a portion of the via hole 130 from the bottom surface of the via hole 130. For example, the first electroplating process for forming the first conductive layer 152 may be performed until an upper space 130H from an entrance of the via hole 130 has a depth D1 of several to several ten μm, e.g., about 1 to 10 μm.

The first conductive layer 152 contains impurities at a relatively low concentration. For example, the first conductive layer 152 may contain impurities at about 0.001 to 10 ppm. The impurities may include at least one selected from the group consisting of C, O, N, S, a halogen group element, an aromatic hydrocarbon compound, an aliphatic hydrocarbon compound, and metal. The metal, as an impurity, is different from the metal that is a main material of the first conductive layer 152, and may have a concentration equal to or less than about 5 ppm in the first conductive layer 152.

Metal grains in the first conductive layer 152 have a relatively large average grain size in range of several hundred nm to several μm. In some embodiments, the metal grains in the first conductive layer 152 have an average grain size in range of about 100 nm to about 3 μm.

If the main material of the first conductive layer 152 is Cu, a plating composition used in the first electroplating process for forming the first conductive layer 152 includes an aqueous electrolyte solution containing Cu ions, and additives. The additives may include a leveling agent, a suppressor, and an accelerator. The leveling agent may be formed of a material having an amino or aromatic functional group.

In order to form the first conductive layer 152, the substrate 102 on which the metal seed layer 144 is formed is dipped into a plating composition. In order to form the first conductive layer 152 that includes Cu as a main material, a plating composition, including an aqueous electrolyte solution containing Cu ions, is used. If power is applied to a target (pure Cu) for forming an anode and the substrate 102 for forming a cathode, Cu ions ($Cu^{2+}$ or $Cu^{+}$) generated from the target move onto the substrate 102 through the aqueous electrolyte solution and the first conductive layer 152 is formed on the barrier layer 142. In the aqueous electrolyte solution, copper salt for providing Cu ions may include copper sulfate, copper oxide, copper chloride, copper fluoroborate, copper nitrate, copper methane sulfonate, copper acetate, copper citrate, copper pyrophosphate, copper sulfamete, copper formate, copper fluoride, or a combination thereof. The copper salt may have a concentration of about 0.1 to 1,000 g/L in the aqueous electrolyte solution.

The aqueous electrolyte solution may include an inorganic acid or an organic acid. For example, the aqueous electrolyte solution may include sulfuric acid, methanesulfonic acid, fluoroboric acid, hydroboric acid, hydrochloric acid, hydroiodic acid, nitric acid, phosphoric acid, boric acid, or a combination thereof The acid may have a concentration of about 0.1 to 1,000 g/L in the aqueous electrolyte solution.

The aqueous electrolyte solution may further include halogen ions such as chloride ions ($Cl^{-}$) or bromide ions ($Br^{-}$). The halogen ions may have a concentration of about 10 to 1,000 ppm in the aqueous electrolyte solution.

From among the additives that may be included in the plating composition, the leveling agent may be adhered onto a surface of the cathode (the substrate 102) at a corner near the entrance of the via hole 130 and thus may reduce a current efficiency and a Cu deposition speed. Since the leveling agent suppresses Cu plating at a corner near the entrance of the via hole 130 and prevents steps from being formed on a layer to be formed by using a plating process, the flatness of a surface of a Cu plating layer may be increased. The leveling agent may have a concentration of about 1 to 5000 ppm in the aqueous electrolyte solution.

The leveling agent may include polyethyleneimine (PEI), dodecyltrimethylammonium chloride (DTAC), dodecyltrimethylammonium bromide (DTAB), polyvinylpyrrolidone (PVP), benzyldimethylhexadecyl ammonium chloride (BDAC), Janus Green B (JGB): diethyl safranine azo dimethyl aniline, polyglycine, poly(allylamine), sulfonated polyaniline (SPAN), sulfopropylated polyethyleneimine (PEI-PS), polyurea, polyacrylamide (PAM), benzotriazole, poly(melamine-co-formaldehyde), polyaminoamides, polyalkanolamine, polyvinylpyridine, polyvinylimidazole, $C_1$ to $C_8$ alkyl-substituted N-vinyl pyridine, poly(vinylimidazol-co-vinylpyridine), poly(vinylimidazole-co-vinylpyrrolidone), lauryl dimethyl betaine, lauryl methyl ethyl betaine, lauryl diethyl betaine, hexyl dimethyl betaine, octyl dimethyl betaine, decyl dimethyl betaine, tetradecyl dimethyl betaine, hexadecyl dimethyl betaine, octadecyl dimethyl betaine, cyclohexyl dimethyl betaine, phenyl dimethyl betaine, tolyl dimethyl betaine, lauramidopropyl betaine, octylamidopropyl betaine, decylamidopropyl betaine, tetradecylamidopropyl betaine, hexadecylamidopropyl betaine, lauramidobutyl betaine, lauramidoethyl betaine, lauramidohexyl betaine, decylamidobutyl betaine, decyamidohexyl betaine, cyclohexylamidopropyl betaine, 1-(3-sulfopropyl) pyridinium betaine, 3-formyl-1-(3-sulfopropyl)pyridinium betaine, methyl-substituted quinolines, isoquinoline 1-propanesulfonic acid, N-vinylcaprolactam, N-vinylbutyrolactam, N-vinylpyrrolidone, vinyl imidazole, N-vinyl carbazole, N-vinyl-succinimide, (meth)acrylonitrile, o-, m-, or p-aminostyrene, maleimide, N-vinyl-oxazolidone, N,N-dimethyl aminoethyl-vinyl-ether, ethyl-2-cyano acrylate, vinyl acetonitrile, N-vinylphthalimide, N-vinyl-pyrrolidones, vinyl pyrroles, vinyl anilines, vinyl piperidines, 3-pyridinesulfonic acid, nicotinamide N-propylsulfonate, alkyl amine oxide, polyethyleneimine ethanol, epichlorohydrin, imidazole polymer, or a combination thereof. However, the inventive concept is not limited thereto, and various leveling agents may be used.

From among the additives that may be included in the plating composition, the suppressor may include a compound having a relatively high molecular weight. The suppressor may suppress growing of a Cu layer or motion of Cu ions to reduce deposition of Cu. The suppressor may form a monolayer on a surface of the Cu layer together with the halogen ions such as Cl⁻ or Br⁻, and the monolayer may block interfacial charge transfer during the Cu plating process. Also, the suppressor may improve wettability on the exposed surface of the substrate 102. The suppressor may have a concentration of about 10 to 10,000 ppm in the aqueous electrolyte solution.

The suppressor may include polyethylene glycol (PEG), polypropylene glycol (PPG), polyethylene glycol polypropylene glycol monobutyl ether block copolymer, or a combination thereof.

From among the additives that may be included in the plating composition, the accelerator may include a compound having a relatively low molecular weight. The accelerator may increase a Cu deposition speed when a bottom-up fill process is performed on the via hole 130. The accelerator may include a sulfur-containing compound. Sulfur is preferentially diffused in a narrow and deep space like the via hole 130. During when Cu ions are reduced in the via hole 130, the accelerator may function as a catalyst to increase a Cu deposition speed. The accelerator may have a concentration of about 1 to 3000 ppm in the aqueous electrolyte solution.

The accelerator may include at least one organic sulfide compound selected from the group consisting of sodium polyanethol sulfonate (SPS), 3-mercaptopropanesulfonic acid (MPS), bis(sodium-sulfopropyl)disulfide, 3-mercapto-1-propanesulfonic acid sodium salt, N,N-dimethyl-dithiocarbamyl propyl sulfonic acid sodium salt, and 3-S-isothiuroniumpropyl sulfonate. Alternatively, the accelerator may include thiourea, allylthiourea, acetylthiourea, pyridine, or a combination thereof.

Figure 5:
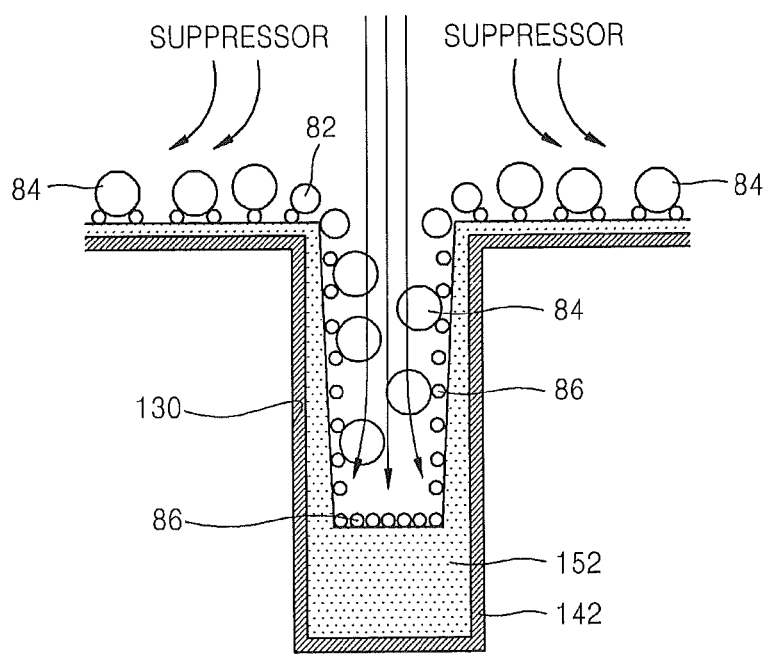
FIG. 5 is a cross-sectional view showing an adhesion-diffusion model of a bottom-up fill process in a via hole according to some embodiments of the inventive concept.

FIG. 5 is a cross-sectional view showing an adhesion-diffusion model of a bottom-up fill process in the via hole 130 when the first conductive layer 152 is formed by using the electroplating process described above in relation to FIG. 4F, according to some embodiments of the inventive concept. A leveling agent 82 is preferentially adhered onto a corner near the entrance of the via hole 130. A suppressor 84 is preferentially adhered onto a top surface of the substrate 102 or the corner near the entrance of the via hole 130. An accelerator 86 is preferentially adhered onto a bottom surface of the via hole 130.

The leveling agent 82, the suppressor 84, and the accelerator 86 may transiently interact with each other during when they are diffused and competitively adhered. Here, the leveling agent 82 and the suppressor 84 may be adhered onto the substrate 102 at a higher speed but may be diffused at a lower speed in comparison to the accelerator 86. Accordingly, in an initial step of forming the first conductive layer 152, the leveling agent 82 and the suppressor 84 may be adhered onto the top surface of the substrate 102 outside the via hole 130 and an upper side wall of the via hole 130 near its entrance. The accelerator 86 is adhered at a lower speed but is diffused at a higher speed in comparison to the leveling agent 82 and the suppressor 84. Accordingly, the accelerator 86 may be adhered onto the bottom surface of the via hole 130 and thus may increase a deposition speed on the bottom surface of the via hole 130.

In some embodiments, the first electroplating process described above in relation to FIG. 4F may be performed by using plating equipment including a plating bath for accommodating the plating composition, a substrate holder for supporting the substrate 102 functioning as a cathode, an anode having a polarity opposite to that of the substrate holder, and a current source for applying a current. In some embodiments, the substrate 102 may rotate at a predetermined speed during the first plating process. For example, the substrate 102 may rotate at about 0.1 to 3000 rpm. In some embodiments, the plating composition may be supplied onto the substrate 102 at a predetermined flow rate. For example, the plating composition may be supplied onto the substrate 102 at about 0.1 to 300 L/min.

In the first electroplating process described above in relation to FIG. 4F, in order to form the first conductive layer 152, while the substrate 102 contacts the plating composition, a voltage is applied between a target for forming an anode and the substrate 102 for forming a cathode so as to generate a forward current, i.e., a cathode current Ic. As a result, Cu ions generated from the target move onto the substrate 102 through the plating composition so as to grow a metal layer on the metal seed layer 144, and thus the first conductive layer 152 is formed. In some embodiments, a forward current, i.e., a cathode current Ic, may be generated between the anode and the cathode. In some embodiments, a period for applying a reverse current, i.e., an anode current Ia, may be inserted between periods for applying the forward current. In some embodiments, a zero current period for applying no current may be inserted between forward current pulses and reverse current pulses.

The first electroplating process is performed while maintaining a first current density that is relatively low. For example, the first electroplating process may be performed while maintaining the first current density selected within a range of about 0.1 to about 5 mA/cm². As a result, a metal deposition speed in the first electroplating process for forming the first conductive layer 152 is less than that at a second current density higher than the first current density. Accordingly, the metal grains for forming the first conductive layer 152 may have a relatively large size.

Figure 6A:
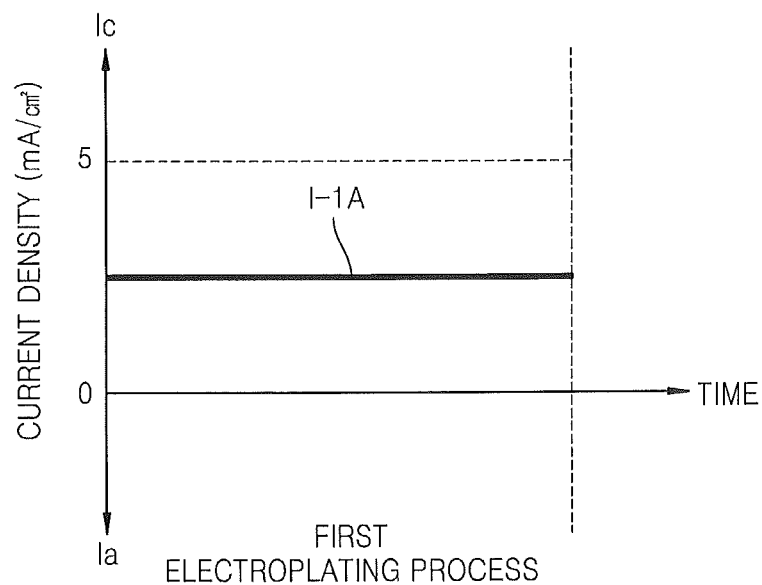
FIGS. 6A through 6C are graphs for describing various methods of applying a current to a substrate during when a first conductive layer is formed by using a first electroplating process according to some embodiments of the inventive concept.
Figure 6B:
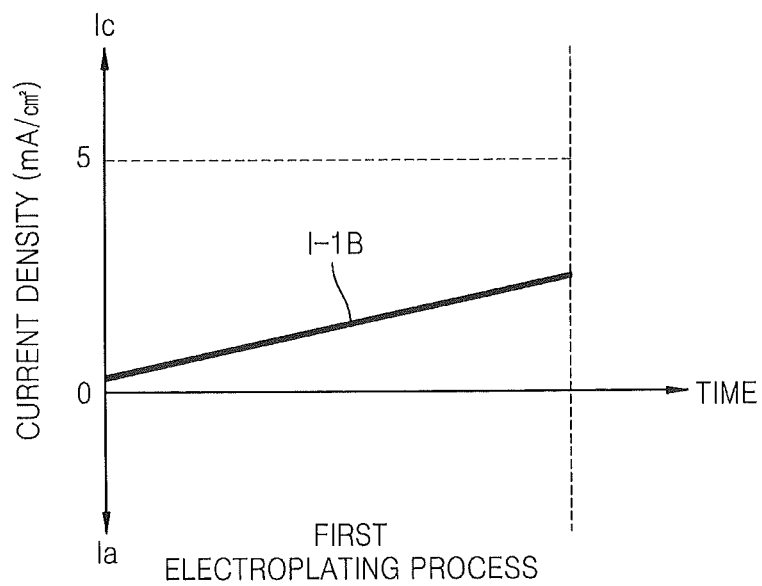
Figure 6C:
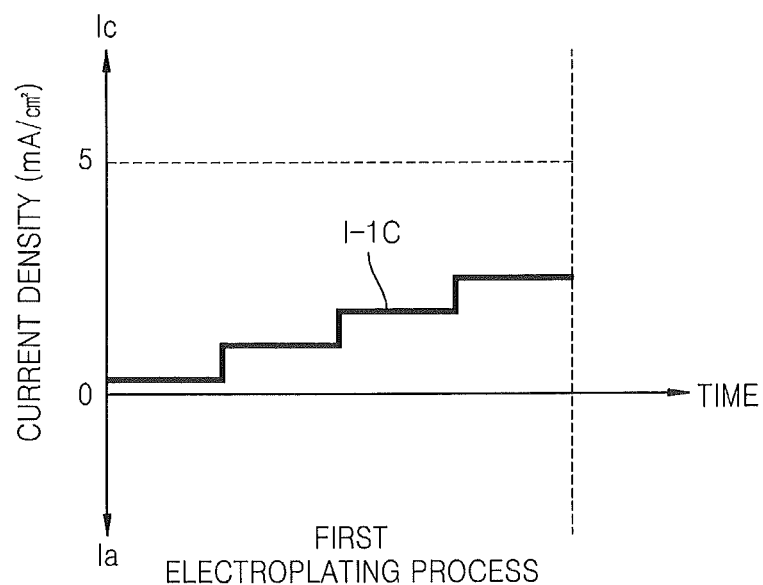

FIGS. 6A through 6C are graphs showing current density variations versus time to describe various methods of applying a current to the substrate 102 during when the first conductive layer 152 is formed by using the first electroplating process described above in relation to FIG. 4F, according to some embodiments of the inventive concept.

As shown in FIG. 6A, during when the first conductive layer 152 is formed, a current in a direct current (DC) mode may be continuously applied to the substrate 102 and thus a forward current I-1A that is maintained constant over time may be generated. In this case, a current density selected within a range of about 0.1 to about 5 mA/cm² may be maintained.

As shown in FIG. 6B, during when the first conductive layer 152 is formed, a current in a DC mode may be continuously applied to the substrate 102 and thus a forward current I-1B that is maintained at a current density selected within a range of about 0.1 to about 5 mA/cm² and is linearly increased over time may be generated.

As shown in FIG. 6C, during when the first conductive layer 152 is formed, a current in a DC mode may be continuously applied to the substrate 102 and thus a forward current I-1C that is maintained at a current density selected within a range of about 0.1 to about 5 mA/cm² and is increased over time in the form of stairs may be generated.

The method of applying a current to form the first conductive layer 152 is not limited to the methods shown in FIGS. 6A through 6C, and a combination of the methods or other various methods may also be used.

FIG. 4F shows that the first conductive layer 152 covers the inner side wall of the via hole 130 near the entrance of the via hole 130. However, the inventive concept is not limited thereto. In some embodiments, if functions of the leveling agent 82 and the suppressor 84, which are described above in relation to FIG. 5, are reinforced in the first electroplating process, a conductive layer may not be formed outside the via hole 130 and on the inner side wall of the via hole 130 near the entrance of the via hole 130, and may be formed only inside the via hole 130 in a bottom-up form from the bottom surface of the via hole 130. In this case, the first conductive layer 152 may have the shape of the first through electrode unit 32E illustrated in FIG. 1B.

Figure 4G:
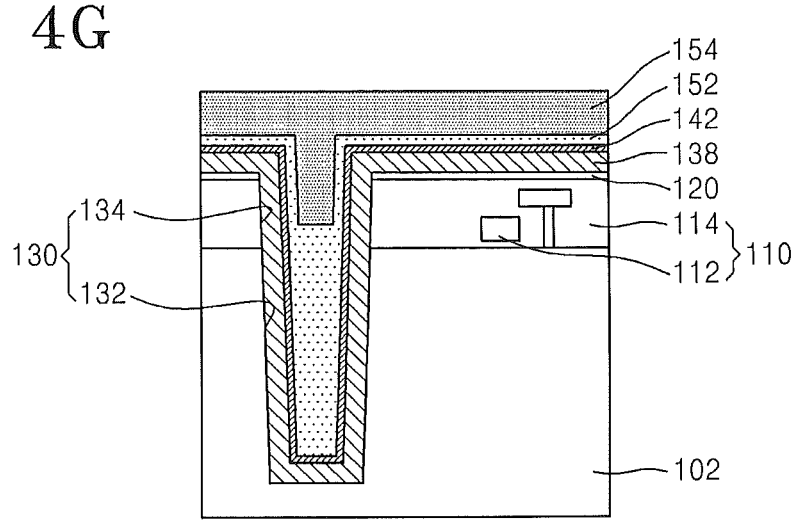

Referring to FIG. 4G, a second conductive layer 154 filling the remaining portion of the via hole 130 from the entrance of the via hole 130 is formed on the first conductive layer 152 by performing a second electroplating process.

A plating composition used in the second electroplating process for forming the second conductive layer 154 may be the same as the plating composition used in the first electroplating process for forming the first conductive layer 152. In some embodiments, the second electroplating process for forming the second conductive layer 154 may be performed immediately after the first electroplating process for forming the first conductive layer 152 is performed.

The second conductive layer 154 contains impurities at a higher concentration than that of the impurities contained in the first conductive layer 152. For example, the second conductive layer 154 may contain impurities at about 1 to 10,000 ppm. The impurities may include at least one selected from the group consisting of C, O, N, S, a halogen group element, an aromatic hydrocarbon compound, an aliphatic hydrocarbon compound, and metal. The metal, as an impurity, is different from the metal that is a main material of the second conductive layer 154, and may have a concentration equal to or less than about 10 ppm in the second conductive layer 154.

From among the additives included in the plating composition used to form the second conductive layer 154, which are stated above in relation to FIG. 5, the leveling agent may be adhered onto the substrate 102 at a high speed but may be diffused at a low speed, and may be adhered onto a top surface of the substrate 102 outside the via hole 130 and portions near the entrance of the via hole 130. Thus, the leveling agent is adhered preferentially onto an upper surface of a corner near the entrance of the via hole 130 rather than inside the via hole 130 during an electroplating process. Accordingly, while, when the first conductive layer 152 is formed as described above in relation to FIG. 4F, a possibility that the leveling agent or its by-product is captured in the first conductive layer 152 is very low, since the second conductive layer 154 is formed on the portions near the entrance of the via hole 130, the leveling agent or its by-product may be easily captured in the second conductive layer 154 during an electroplating process and thus may remain at grain boundaries of metal grains for forming the second conductive layer 154.

Due to the leveling agent that remains at the grain boundaries of the metal grains, growing of the metal grains in the second conductive layer 154 may be suppressed and a grain size of the metal grains may not be sufficiently increased. Also, since new metal cores are formed on the metal grains before the metal grains are sufficiently grown, the metal grains for forming the second conductive layer 154 have an average grain size less than that of the metal grains for forming the first conductive layer 152. The metal grains in the second conductive layer 154 may have a relatively small average grain size within a range of several to several hundred nm. For example, the metal grains in the second conductive layer 154 may be about 1.5 to about 10 times smaller than the metal grains in the first conductive layer 152. In some embodiments, the metal grains in the second conductive layer 154 have an average grain size equal to or less than about 100 nm.

The metal grains having a relatively small size in the second conductive layer 154 may be grown when a thermal budget is applied to the second conductive layer 154 in a subsequent process. As such, stress relaxation may be achieved. Accordingly, irreversible deformation (plastic deformation) due to a thermal budget may be suppressed and local extrusion may be prevented in a TSV structure formed by the second conductive layer 154.

In order to form the second conductive layer 154 by using the second electroplating process described above in relation to FIG. 4G, while the substrate 102 contacts the plating composition, a voltage is applied between a target for forming an anode and the substrate 102 for forming a cathode. As a result, Cu ions generated from the target may move onto the substrate 102 through the plating composition and the second conductive layer 154 may be formed on the first conductive layer 152. In some embodiments, a forward current, i.e., a cathode current Ic, may be generated between the anode and the cathode. In some embodiments, a period for applying a reverse current, i.e., an anode current Ia, may be inserted between periods for applying the forward current. In some embodiments, a zero current period for applying no current may be inserted between a forward current pulse and a reverse current pulse.

The second electroplating process for forming the second conductive layer 154 may be performed while maintaining the second current density that is relatively high. For example, the second electroplating process may be performed while maintaining the second current density selected within a range of about 5 to about 100 mA/cm². If a current density is increased, a metal plating speed is increased and a plating layer having metal grains with a relatively small size is obtained. In particular, due to the second current density that is relatively high and is used in the second electroplating process for forming the second conductive layer 154, a metal deposition speed when the second conductive layer 154 is formed is greater than that when the first conductive layer 152 is formed. Accordingly, the second conductive layer 154 formed of metal grains having an average grain size less than that of the metal grains for forming the first conductive layer 152 may be obtained.

Also, since a current-focused portion grows preferentially if a current density is high, a dendrite structure may be formed and twin boundaries may be generated in a plating layer. If twin boundaries exist in the second conductive layer 154, after a subsequent annealing process is performed, a plurality of sub-microvoids may be formed near the twin boundaries. The sub-microvoids in the second conductive layer 154 may function as a stress relaxation component when a thermal budget is applied to the second conductive layer 154 in a subsequent process. Accordingly, local extrusion due to a thermal budget in a TSV structure formed by the second conductive layer 154 may be reduced.

Figure 7:
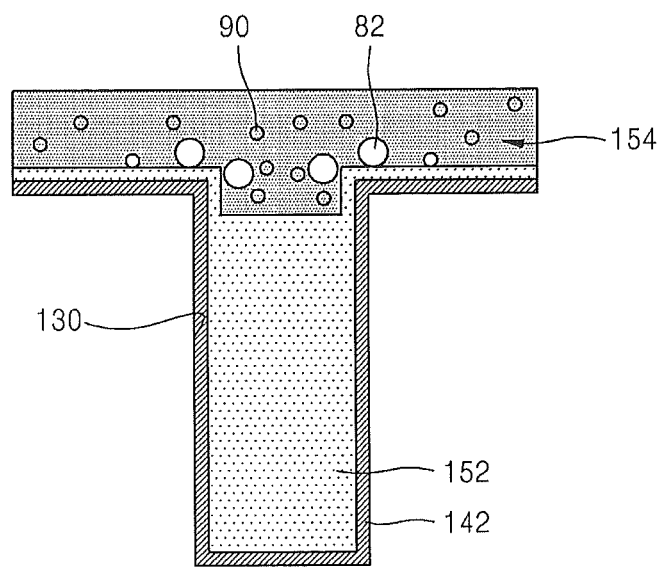
FIG. 7 is a cross-sectional view showing a model of capturing an additive adhered onto a substrate and another impurity into a second conductive layer according to some embodiments of the inventive concept.

FIG. 7 is a cross-sectional view showing a model of capturing an additive, more particularly a leveling agent 82 and another impurity 90, into the second conductive layer 154 during when the second conductive layer 154 is formed by using the second electroplating process described above in relation to FIG. 4G, according to some embodiments of the inventive concept. When the plating composition contacts the substrate 102, the leveling agent 82 is preferentially adhered onto a corner of an entrance of the via hole 130. Since the second conductive layer 154 is formed at a high plating speed, during when the second conductive layer 154 is formed on the first conductive layer 152 that is formed on the substrate 102, metal for forming the second conductive layer 154 may be deposited on the leveling agent 82 that remains on the corner of the entrance of the via hole 130 while the leveling agent 82 or its reaction by-product, and the impurity 90 are being captured between metal grains in the second conductive layer 154.

FIGS. 8A through 8F are graphs showing current density variations versus time to describe various methods of applying a current in the second electroplating process described above in relation to FIG. 4G, according to some embodiments of the inventive concept.

Figure 8A:
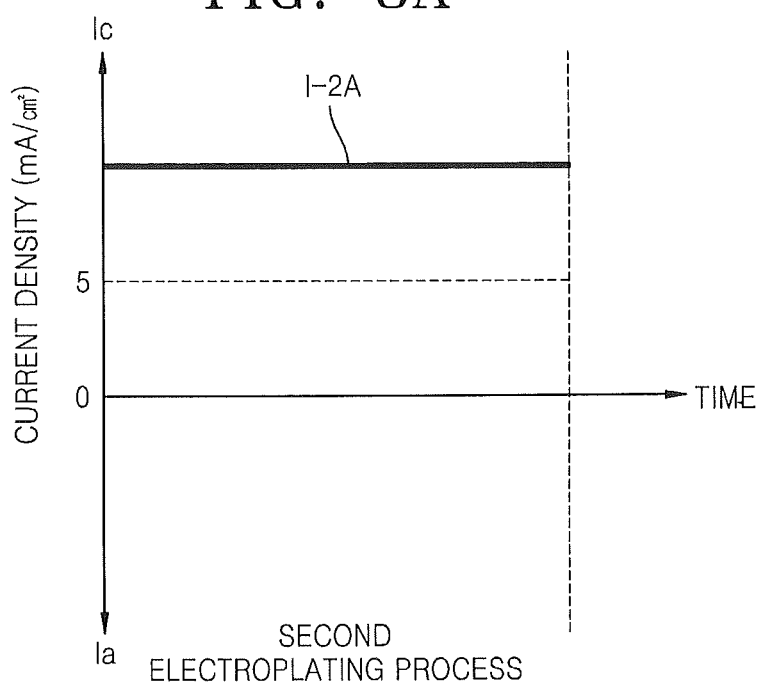
FIGS. 8A through 8F are graphs for describing various methods of applying a current in a second electroplating process according to some embodiments of the inventive concept.

As shown in FIG. 8A, during when the second conductive layer 154 is formed by using the second electroplating process, a current in a DC mode may be continuously applied to the substrate 102 and thus a forward current I-2A that is maintained constant over time may be generated. In this case, a current density selected within a range of about 5 to about 100 mA/cm$^2$ may be maintained.

Figure 8B:
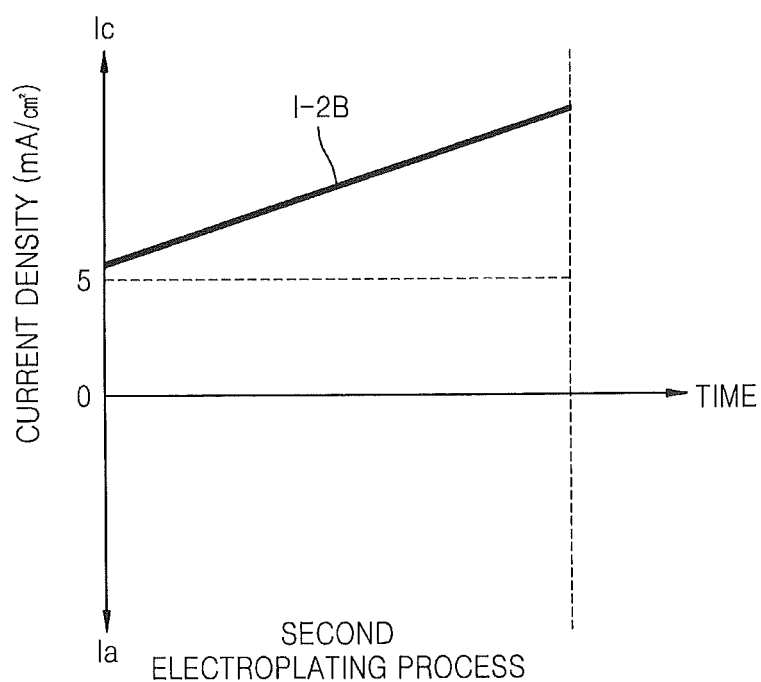

As shown in FIG. 8B, during when the second conductive layer 154 is formed by using the second electroplating process, a current in a DC mode may be continuously applied to the substrate 102 and thus a forward current I-2B that is maintained at a current density selected within a range of about 5 to about 100 mA/cm$^2$ and is linearly increased over time may be generated.

Figure 8C:
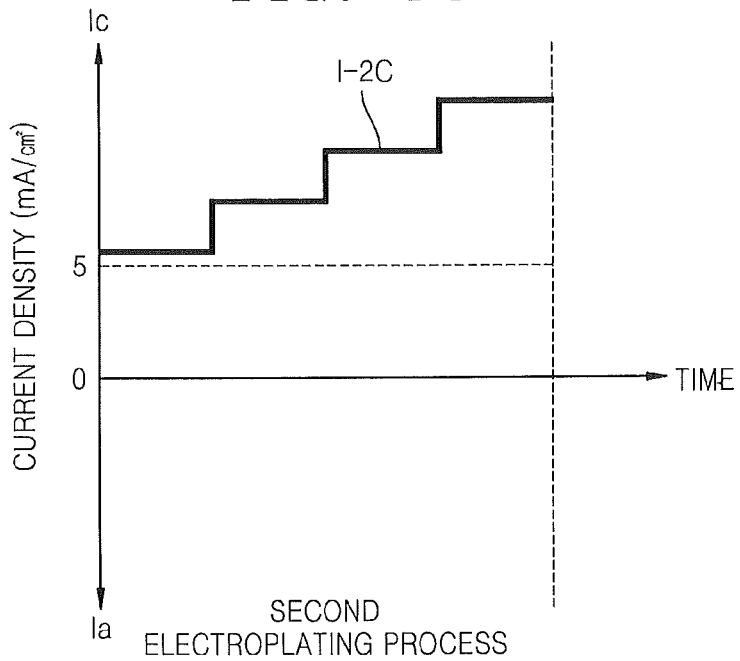

As shown in FIG. 8C, during when the second conductive layer 154 is formed by using the second electroplating process, a current in a DC mode may be continuously applied to the substrate 102 and thus a forward current I-2C that is maintained at a current density selected within a range of about 5 to about 100 mA/cm$^2$ and is increased over time in the form of stairs may be generated.

Figure 8D:
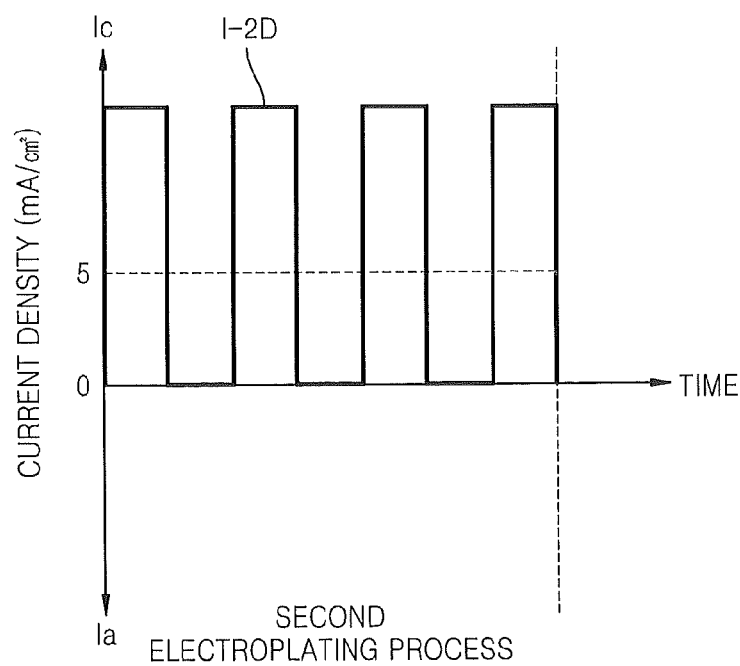

As shown in FIG. 8D, during when the second conductive layer 154 is formed by using the second electroplating process, a current I-2D in a pulsed current (PC) mode, which is maintained at an average current density selected within a range of about 5 to about 100 mA/cm$^2$ and is cyclically applied and paused, may be applied to the substrate 102. A zero current period for applying no current may be inserted between forward current pulses of the current I-2D.

Figure 8E:
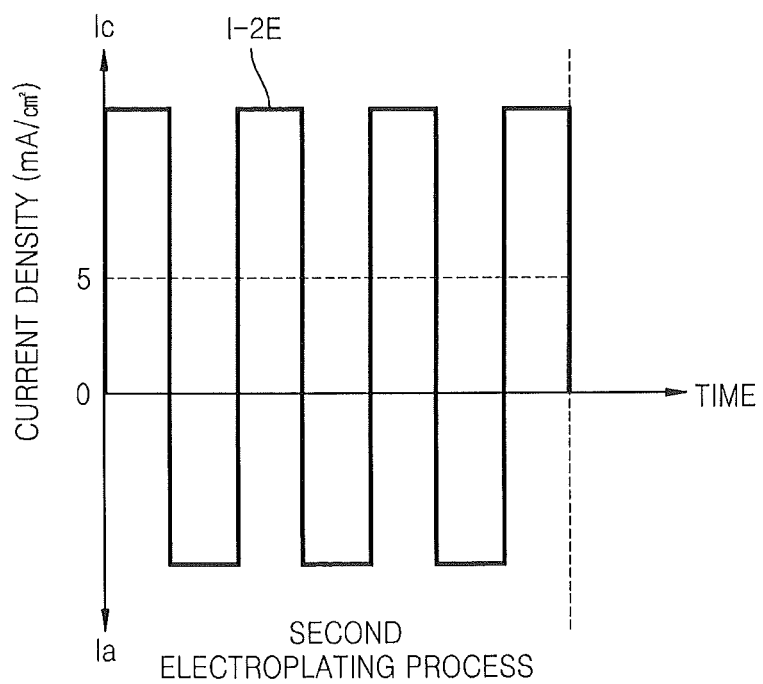

As shown in FIG. 8E, during when the second conductive layer 154 is formed by using the second electroplating process, a current I-2E in a pulse reverse current (PRC) mode, which is maintained at an average current density selected within a range of about 5 to about 100 mA/cm$^2$ and in which a plurality of forward current pulses and a plurality of reverse current pulses are alternately repeated, may be applied to the substrate 102.

Figure 8F:
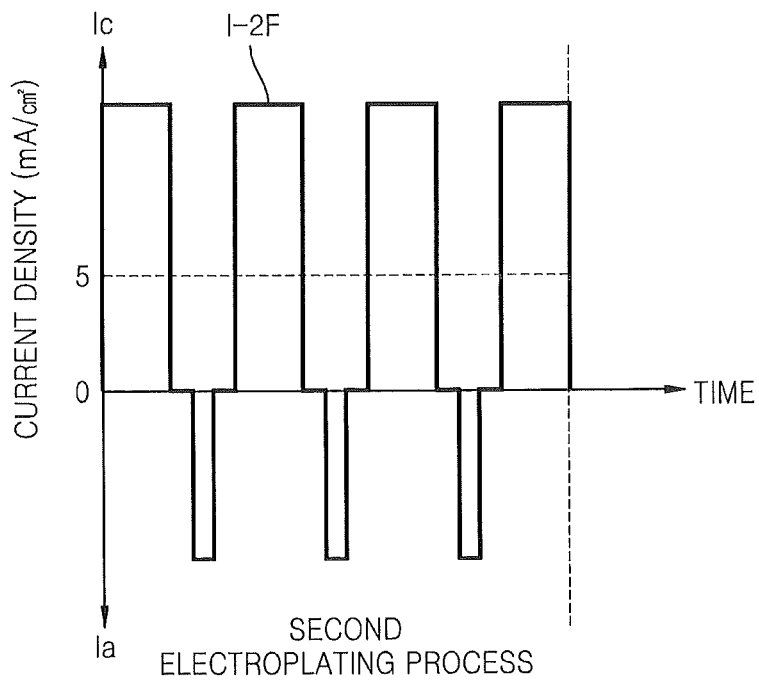

As shown in FIG. 8F, during when the second conductive layer 154 is formed by using the second electroplating process, a current I-2F in a PRC mode, which is maintained at an average current density selected within a range of about 5 to about 100 mA/cm$^2$ and in which a plurality of forward current pulses and a plurality of reverse current pulses are alternately repeated, may be applied to the substrate 102, and a zero current period for applying no current may be inserted between a forward current pulse and a reverse current pulse of the current I-2F.

The method of applying a current to form the second conductive layer 154 in the second electroplating process is not limited to the methods shown in FIGS. 8A through 8F, and a combination of the methods or other various methods may also be used.

In a plating process using a PC- or PRC-mode current applying method as shown in FIGS. 8D through 8F, forming of cores, rather than growing of cores, may be promoted due to instant switches between an ON time and an OFF time. Accordingly, the number of chances for forming metal cores may be greater than that in a plating process using a DC-mode current applying method. As a result, metal grains may have a small grain size and metal grains having a relatively large grain size may be partially etched when a reverse current pulse is applied. Also, in the plating process using a PC- or PRC-mode current applying method, a more planar plating layer may be obtained in comparison to the plating process using a DC-mode current applying method, and hydrogen or impurities included in a plating composition may be relatively easily captured into a plating layer during a plating process.

The first and second electroplating processes described above in relation to FIGS. 4F and 4G may be performed at about 10 to 65° C. For example, the first and second electroplating processes may be performed at room temperature. After the second conductive layer 154 is formed, if necessary, the formed first and second conductive layers 152 and 154 may be annealed at about 150 to 450° C.

Figure 4H:
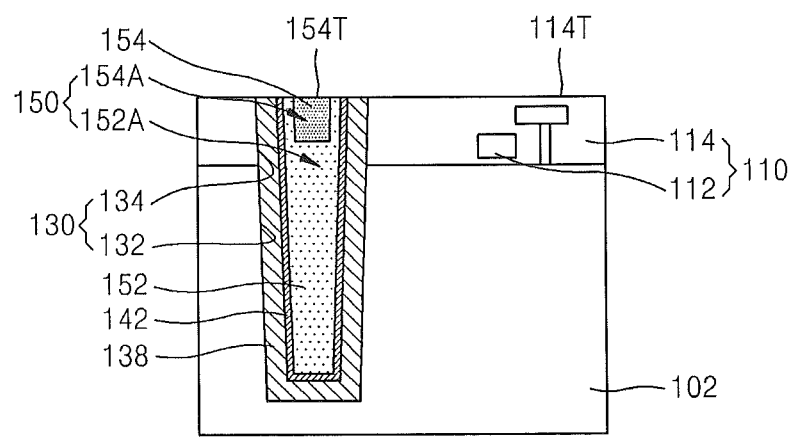

Referring to FIG. 4H, the polishing stopper 120 (see FIG. 4G) is used to polish the structure including the second conductive layer 154 by using a chemical mechanical polishing (CMP) process, and then is removed. As a result, the first conductive layer 152 that remains in the via hole 130 forms a first through electrode unit 152A, and the second conductive layer 154 that remains in the via hole 130 on the first through electrode unit 152A forms a second through electrode unit 154A. The first and second through electrode units 152A and 154A form a TSV structure 150.

The second through electrode unit 154A may have a top surface 154T at the same level as a top surface 114T of the interlayer insulating layer 114.

The TSV structure 150, including the first and second through electrode units 152A and 154A, may correspond to the TSV structure 30 including the first and second through electrode units 32 and 34 illustrated in FIG. 1. The substrate 102 and the FEOL structure 110 may correspond to the semiconductor structure 20 illustrated in FIG. 1.

As appreciated by the present inventors, the TSV structure 150 may be separated from the substrate 102 or the interlayer insulating layer 114 when thermal stress is applied because materials included in the TSV structure 150 may have coefficients of thermal expansion that are different from those of in the substrate 102 and the interlayer insulating layer 114.

In FIG. 4H, the second through electrode unit 154A contains the impurities at a higher concentration in comparison to the first through electrode unit 152A, and thus the metal grains for forming the second through electrode unit 154A have an average grain size less than that of the metal grains for forming the first through electrode unit 152A. When thermal stress is applied through subsequent processes, a large number of stress relaxation components, e.g., growing of grains and forming of sub-microvoids, may be included and thus local extrusion of the TSV structure 150 may be reduced.

Figure 4I:
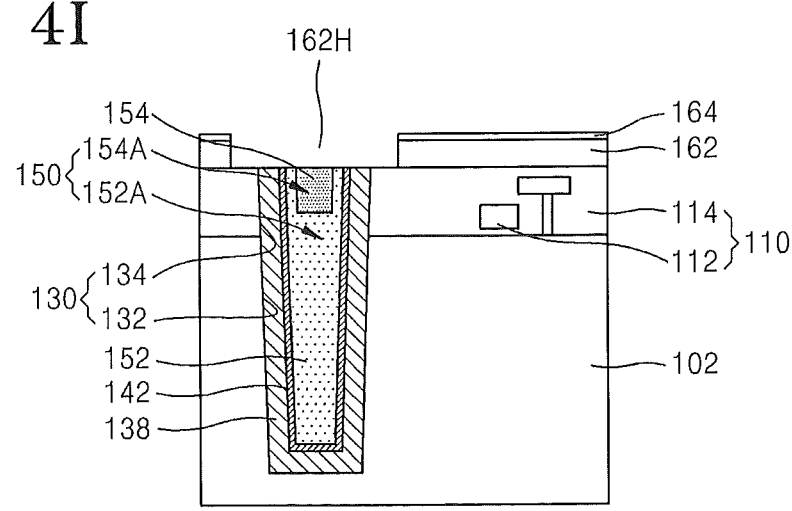

Referring to FIG. 4I, an inter-metal-layer insulating layer 162 and a polishing stopper 164 are sequentially formed and then patterned on the interlayer insulating layer 114 and thus a wiring hole 162H for exposing a top surface of the TSV structure 150 and portions around the top surface near the entrance of the via hole 130 is formed. The inter-metal-layer insulating layer 162 may include an etching stopper formed directly on the interlayer insulating layer 114. The etching stopper may be used to etch the inter-metal-layer insulating layer 162 and the polishing stopper 164 in order to form the wiring hole 162H.

The wiring hole 162H exposes the TSV structure 150, the barrier layer 142 that surrounds a side wall of the TSV structure 150, the insulating layer 138 around the barrier layer 142, and a portion of the interlayer insulating layer 114. In some embodiments, the wiring hole 162H may expose only the top surface of the TSV structure 150.

In some embodiments, the inter-metal-layer insulating layer 162 is formed of tetra-ethyl-ortho-silicate (TEOS), and the polishing stopper 164 is formed as a silicon oxynitride layer. Thicknesses of the inter-metal-layer insulating layer 162 and the polishing stopper 164 may be arbitrarily determined according to necessity.

Figure 4J:
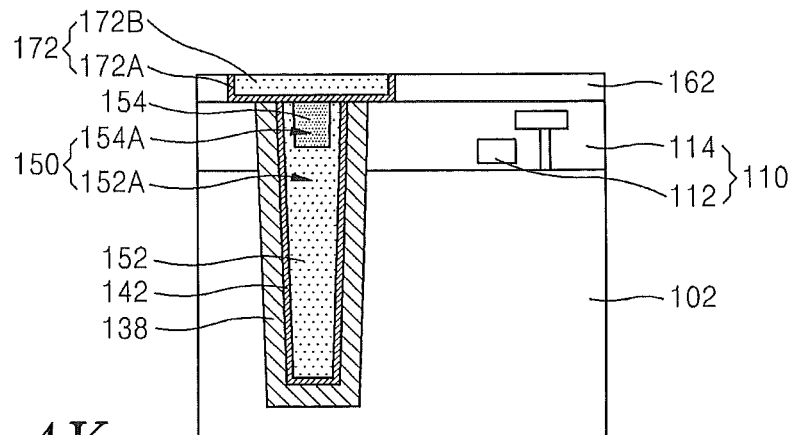

Referring to FIG. 4J, a metal wiring layer 172 is formed in the wiring hole 162H.

The metal wiring layer 172 has a structure in which a barrier layer 172A and a metal layer 172B for wiring are sequentially stacked. In some embodiments, in order to form the metal wiring layer 172, a first layer for forming the barrier layer 172A and a second layer for forming the metal layer 172B are sequentially formed in the wiring hole 162H and on the polishing stopper 164 (see FIG. 4I), and the polishing stopper 164 is used to perform CMP on the formed first and second layers and then is removed to expose a top surface of the inter-metal-layer insulating layer 162. As a result, the barrier layer 172A and the metal layer 172B remain in the wiring hole 162H.

In some embodiments, the barrier layer 172A may include at least one material selected from the group consisting of Ti, TiN, Ta, and TaN. In some embodiments, the barrier layer 172A may be formed by using a PVD process. The barrier layer 172A may have a thickness of about 1000 to 1500 Å.

In some embodiments, the metal layer 172B includes Cu. In order to form the metal layer 172B, a Cu seed layer may be formed on a surface of the barrier layer 172A, an electroplating process may be performed to grow a Cu layer on the Cu seed layer, and the formed Cu layer may be annealed.

Figure 4K:
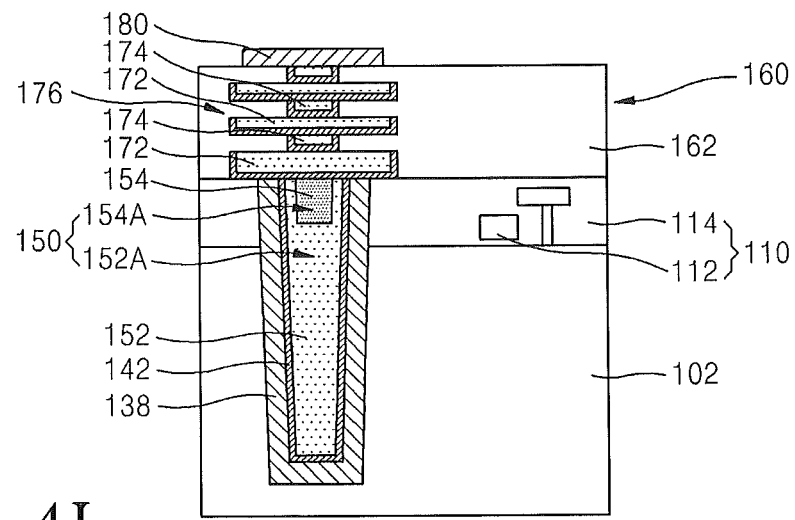

Referring to FIG. 4K, a contact plug 174 having the same stacked structure as the metal wiring layer 172 is formed on the metal wiring layer 172 by using a process similar to the process of forming the metal wiring layer 172 described above in relation to FIGS. 4I and 4J. After that, a multilayer wiring pattern 176 for a through electrode is formed by alternately repeating the process of forming the metal wiring layer 172 and the process of forming the contact plug 174 so as to alternately stack a plurality of metal wiring layers 172 and a plurality of contact plugs 174.

In some embodiments, when the multilayer wiring pattern 176 is formed, other multilayer wiring patterns including metal wiring layers and contact plugs formed simultaneously with at least some of the metal wiring layers 172 and the contact plugs 174 are formed on other regions of the substrate 102. As a result, a back-end-of-line (BEOL) structure 160 including a plurality of multilayer wiring patterns including the inter-metal-layer insulating layer 162 and portions insulated by the inter-metal-layer insulating layer 162 is formed on the FEOL structure 110. The BEOL structure 160 may include a plurality of wiring structures for connecting individual devices formed in the FEOL structure 110 to other wirings formed on the substrate 102. In some embodiments, the BEOL structure 160 may further include a seal ring for protecting the wiring structures and other structures under the wiring structures from external impact or moisture.

After that, a contact pad 180 electrically connected to the multilayer wiring pattern 176 is formed on the inter-metal-layer insulating layer 162.

The inter-metal-layer insulating layer 162 spaces the metal wiring layers 172 apart from each other. The metal wiring layers 172 and the contact plugs 174 may be electrically separated by the inter-metal-layer insulating layer 162 from other adjacent wirings at the same level.

Although FIG. 4K shows that the multilayer wiring pattern 176 includes three metal wiring layers 172 and three contact plugs 174, the inventive concept is not limited thereto. Also, the connection structure between the metal wiring layers 172 and the contact plugs 174 of the multilayer wiring pattern 176 is exemplarily illustrated in FIG. 4K, and the inventive concept is not limited thereto.

In some embodiments, each of the metal wiring layers 172 and the contact plugs 174 may include at least one of metal selected from the group consisting of W, Al, and Cu. In some embodiments, the metal wiring layers 172 and the contact plugs 174 may be formed of the same material. In some embodiments, at least some of the metal wiring layers 172 and the contact plugs 174 may include different materials.

In some embodiments, a plurality of other multilayer wiring patterns are formed at the same level as the multilayer wiring pattern 176 in the inter-metal-layer insulating layer 162. Also, a plurality of other contact pads may be formed at the same level as the contact pad 180 on the inter-metal-layer insulating layer 162.

Figure 4L:
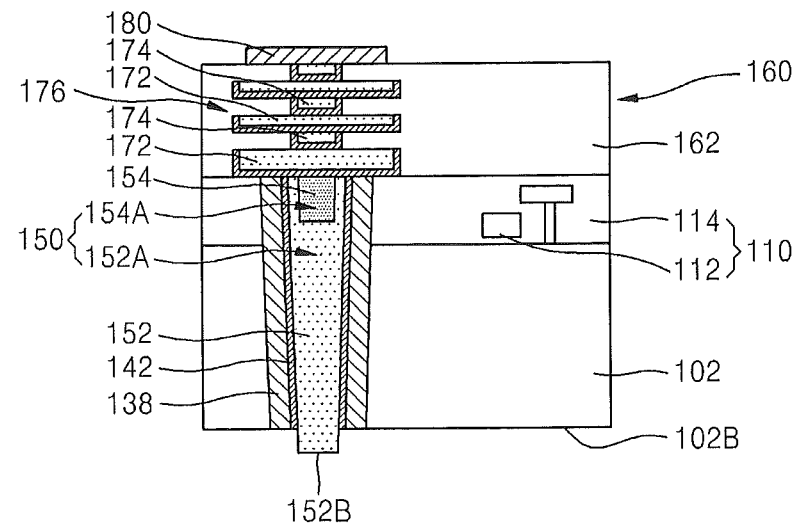

Referring to FIG. 4L, the substrate 102 is partially removed from its bottom surface 102B to expose a bottom surface 152B of the first through electrode unit 152A of the TSV structure 150.

As illustrated in FIG. 4L, the substrate 102 may be partially removed such that the bottom surface 152B of the first through electrode unit 152A is extruded from the bottom surface 102B of the substrate 102. In some embodiments, the substrate 102 may be partially removed from its bottom surface 102B by using a CMP process, an etch back process, or a combination thereof.

After the substrate 102 is partially removed from its bottom surface 102B, the via hole 130 (see FIG. 4B) becomes a through hole that penetrates through the substrate 102 and the interlayer insulating layer 114.

After the bottom surface 152B of the first through electrode unit 152A is exposed, the insulating layer 138 that surrounds the TSV structure 150 around the extruded portion of the first through electrode unit 152A is removed by using an isotropic or anisotropic etching process. After that, the barrier layer 142 exposed by removing the insulating layer 138 is also removed to expose a side wall of the first through electrode unit 152A near the bottom surface 152B.

Figure 4M:
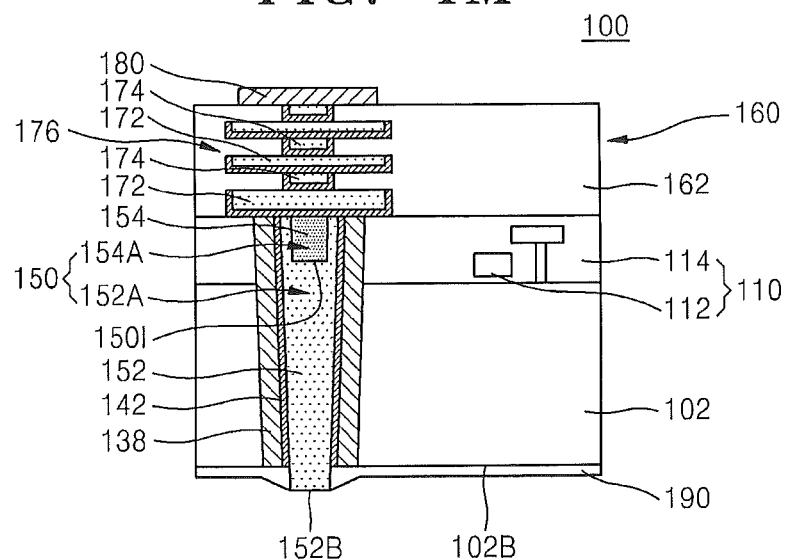

Referring to FIG. 4M, a backside insulating layer 190 is formed to cover the bottom surface 102B of the substrate 102 around the bottom surface 152B of the first through electrode unit 152A in the TSV structure 150, thereby forming the integrated circuit device 100.

In some embodiments, the backside insulating layer 190 may be formed by using a spin coating process or a spray process. The backside insulating layer 190 may be formed of a polymer. In some embodiments, in order to form the backside insulating layer 190, a polymer layer may be formed to completely cover the bottom surface 102B of the substrate 102 and the exposed portion of the first through electrode unit 152A near the bottom surface 152B, and may be partially etched back to expose the bottom surface 152B of the first through electrode unit 152A in the TSV structure 150.

In the integrated circuit device 100, the barrier layer 142 surrounds the first and second through electrode units 152A and 154A. The side wall of the first through electrode unit 152A includes a portion surrounded by the substrate 102 and a portion surrounded by the interlayer insulating layer 114. The second through electrode unit 154A has a side wall surrounded by the interlayer insulating layer 114. An interface 150I between the first and second through electrode units 152A and 154A exists at a portion of the TSV structure 150 surrounded by the interlayer insulating layer 114.

Figure 9:
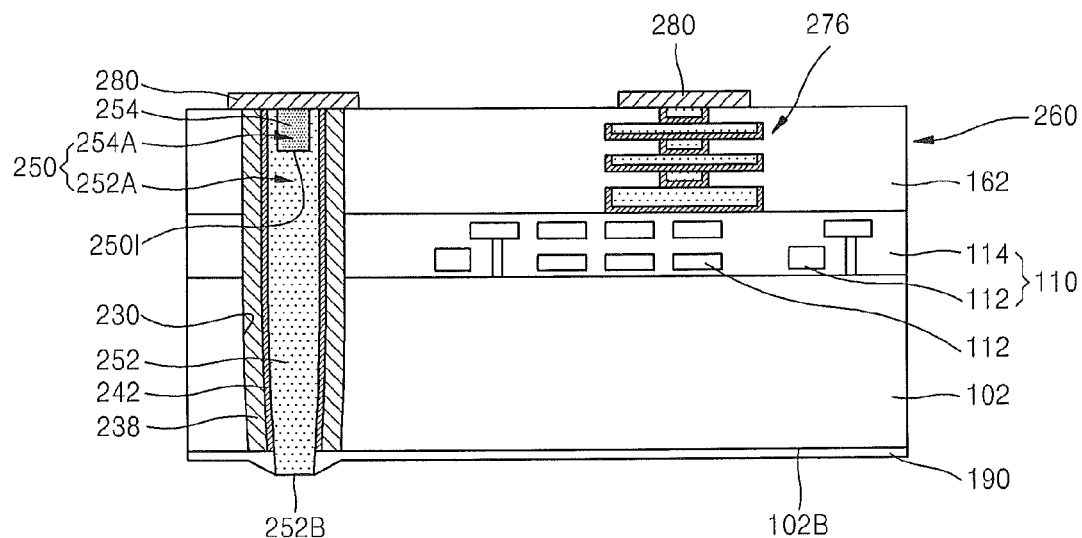
FIG. 9 is a cross-sectional view of a main portion of an integrated circuit device, according to some embodiments of the inventive concept.

FIG. 9 is a cross-sectional view of a main portion of an integrated circuit device 200, according to some embodiments of the inventive concept.

In the integrated circuit device 200, a TSV structure 250 includes a first through electrode unit 252A including a first conductive layer 252, and a second through electrode unit 254A including a second conductive layer 254.

The first and second conductive layers 252 and 254, and the first and second through electrode units 252A and 254A are similar to the first and second conductive layers 152 and 154, and the first and second through electrode units 152A and 154A illustrated in FIGS. 4A through 4M.

In the integrated circuit device 200, the TSV structure 250 penetrates through the substrate 102, the interlayer insulating layer 114, and the inter-metal-layer insulating layer 162. Each of the first and second through electrode units 252A and 254A is surrounded by a barrier layer 242. The barrier layer 242 is surrounded by an insulating layer 238. A side wall of the first through electrode unit 252A includes a portion surrounded by the substrate 102, a portion surrounded by the interlayer insulating layer 114, and a portion surrounded by the inter-metal-layer insulating layer 162. The second through electrode unit 254A has a side wall surrounded by the inter-metal-layer insulating layer 162. An interface 250I between the first and second through electrode units 252A and 254A exists at a portion of the TSV structure 250 surrounded by the inter-metal-layer insulating layer 162.

The insulating layer 238 and the barrier layer 242 are similar to the insulating layer 138 and the barrier layer 142 illustrated in FIGS. 4A through 4M. The insulating layer 238 and the barrier layer 242 extend to penetrate through the substrate 102, the interlayer insulating layer 114, and the inter-metal-layer insulating layer 162.

The TSV structure 250 may be formed by using a series of the following processes.

The FEOL structure 110 is formed by using the method described above in relation to FIG. 4A, and then the BEOL structure 260, including a multilayer wiring pattern 276 and the inter-metal-layer insulating layer 162, is formed on the FEOL structure 110 by using the process of forming the BEOL structure 160, including the multilayer wiring pattern 176 and the inter-metal-layer insulating layer 162, described above in relation to FIGS. 4I through 4K.

A via hole 230 is formed by sequentially etching the inter-metal-layer insulating layer 162, the interlayer insulating layer 114, and the substrate 102, and the insulating layer 238, the barrier layer 242, and the TSV structure 250 are formed in the via hole 230 by using a process similar to the process of forming the insulating layer 138, the barrier layer 142, and the TSV structure 150 described above in relation to FIGS. 4A through 4H. A plurality of contact pads 280 are formed on the TSV structure 250 and the multilayer wiring pattern 276 and electrically connected to the TSV structure 250 and the multilayer wiring pattern 276.

A bottom surface 252B of the first conductive layer 252 is exposed by using the method described above in FIGS. 4L and 4M, and then the backside insulating layer 190 is formed to cover a bottom surface of the substrate 102, thereby forming the integrated circuit device 200.

FIGS. 10A through 10H are cross-sectional views for describing a method of manufacturing an integrated circuit device 300 (see FIG. 10H), according to some embodiments of the inventive concept.

Figure 10A:
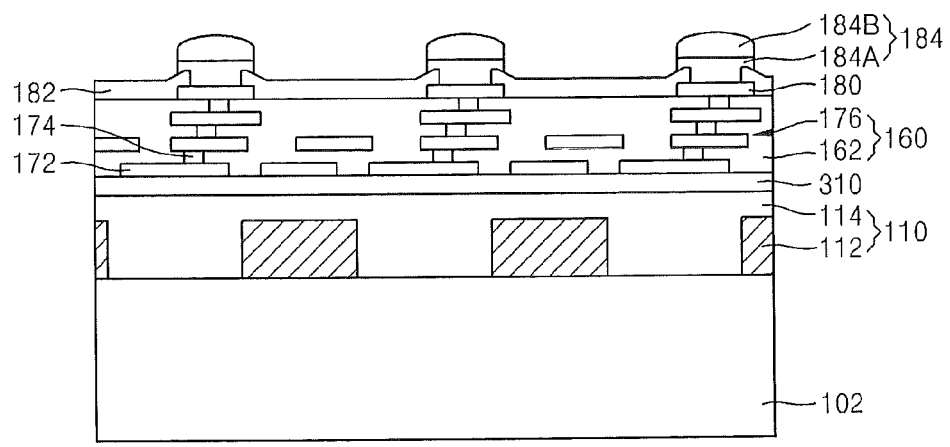
FIGS. 10A through 10H are cross-sectional views illustrating a method of manufacturing an integrated circuit device, according to some embodiments of the inventive concept.

Referring to FIG. 10A, the FEOL structure 110, including the individual devices 112 and the interlayer insulating layer 114, is formed on the substrate 102, an etching stopper 310 is formed on the FEOL structure 110, the BEOL structure 160 is formed on the etching stopper 310. The BEOL structure 160 includes the inter-metal-layer insulating layer 162 and a plurality of multilayer wiring patterns 176. Each of the multilayer wiring patterns 176 includes the metal wiring layers 172 and the contact plugs 174.

A plurality of contact pads 180 are formed on the inter-metal-layer insulating layer 162, and a passivation layer 182 and a plurality of bumps 184 are formed on the BEOL structure 160. Although each of the bumps 184 includes a stacked structure of first and second metal layers 184A and 184B in FIG. 10A, the inventive concept is not limited thereto, and the bumps 184 may have various structures.

Figure 10B:
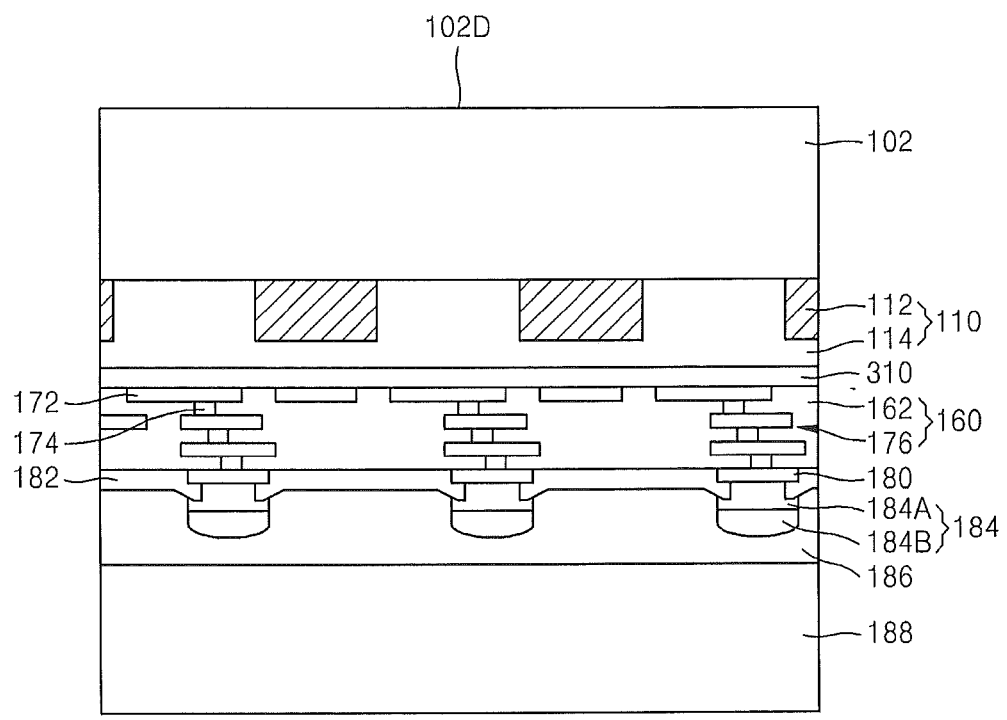

Referring to FIG. 10B, an adhesive coating layer 186 is formed on a surface of the substrate 102 on which the bumps 184 are formed, and the substrate 102 on which the bumps 184 are formed is mounted on a wafer supporting substrate 188 by using the adhesive coating layer 186 as a bonding material.

A backside 102D of the substrate 102 opposite to the surface of the substrate 102 covered by the wafer supporting substrate 188 is exposed externally.

Figure 10C:
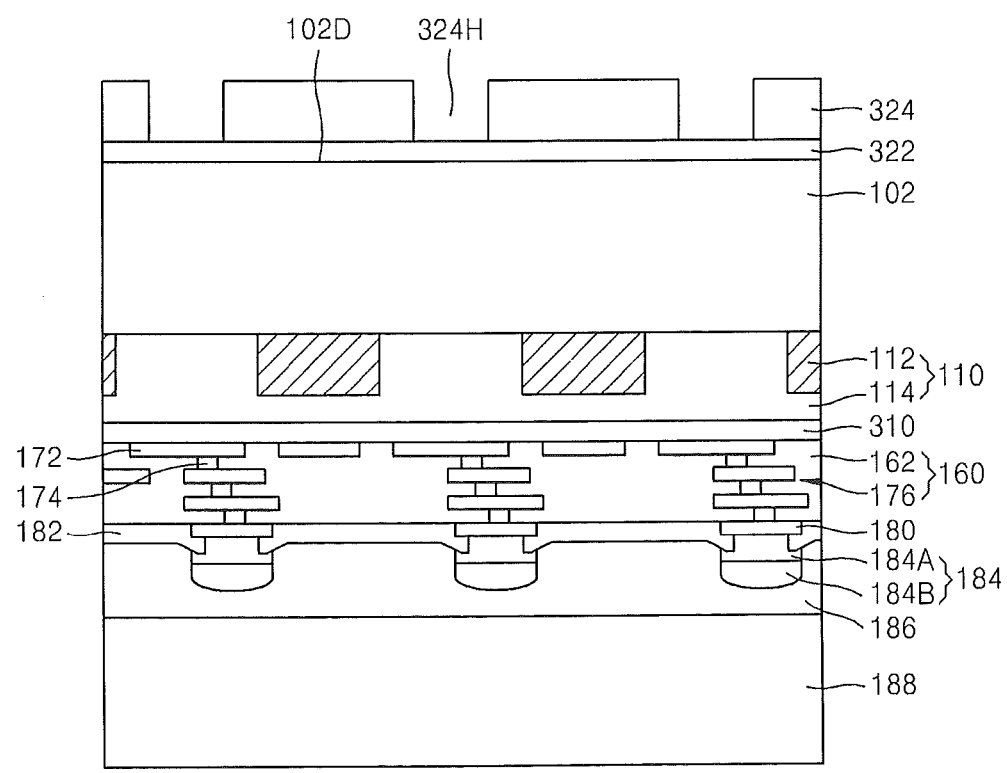

Referring to FIG. 10C, a hard mask layer 322 is formed on the backside 102D of the substrate 102, and then a mask pattern 324 is formed on the hard mask layer 322.

In some embodiments, the hard mask layer 322 is formed as a silicon nitride layer. The hard mask layer 322 may have a thickness of about 200 to 1000 Å.

One or more holes 324H for partially exposing a top surface of the hard mask layer 322 are formed in the mask pattern 324. In some embodiments, the mask pattern 324 is formed of a photoresist material.

Figure 10D:
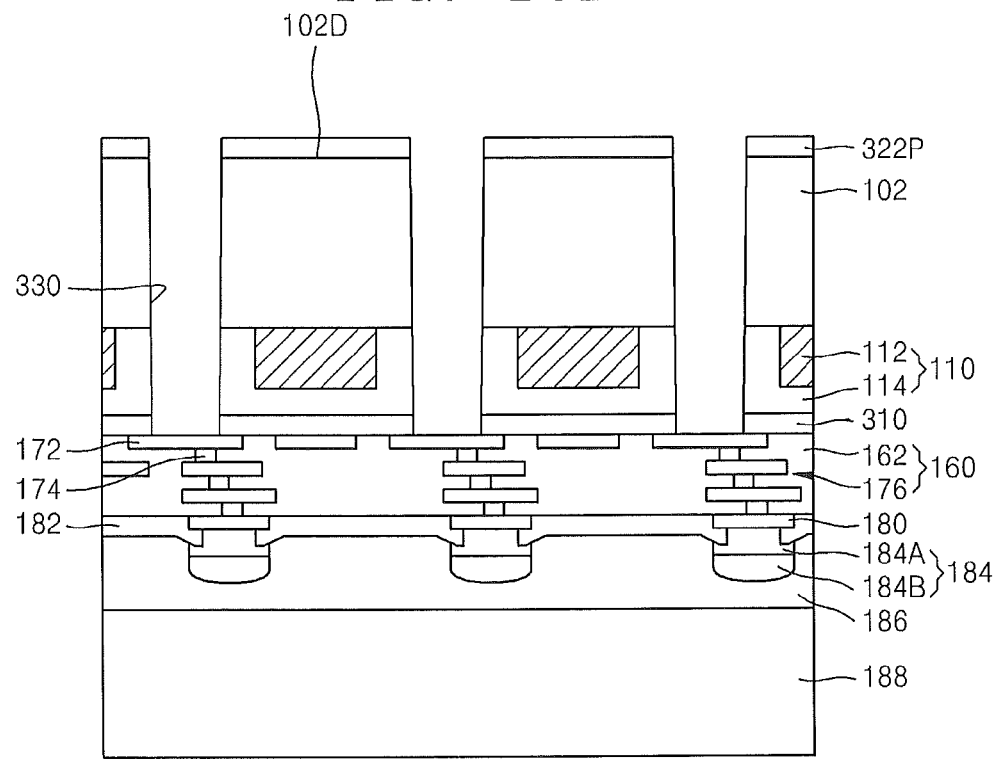

Referring to FIG. 10D, a hard mask pattern 322P is formed by etching the hard mask layer 322 by using the mask pattern 324 (see FIG. 10C) as an etching mask, and a plurality of via holes 330 for exposing the metal wiring layers 172 are formed by etching the substrate 102 and the etching stopper 310 by using the mask pattern 324 and the hard mask pattern 322P as an etching mask. The via holes 330 extend to penetrate through the substrate 102 and the interlayer insulating layer 114 of the FEOL structure 110.

The via holes 330 may be formed by using an anisotropic etching process or a laser drilling process. In some embodiments, when the via holes 330 are formed by etching the interlayer insulating layer 114, an etching stop point may be determined by using the etching stopper 310. The via holes 330 may have a width equal to or less than about 10 μm, and a depth of about 50 to 100 μm. However, the via holes 330 are not limited to the above-mentioned width and depth and may have various sizes according to necessity.

After the via holes 330 are formed, a top surface of the hard mask pattern 322P is exposed by removing the mask pattern 324 (see FIG. 10C).

Figure 10E:
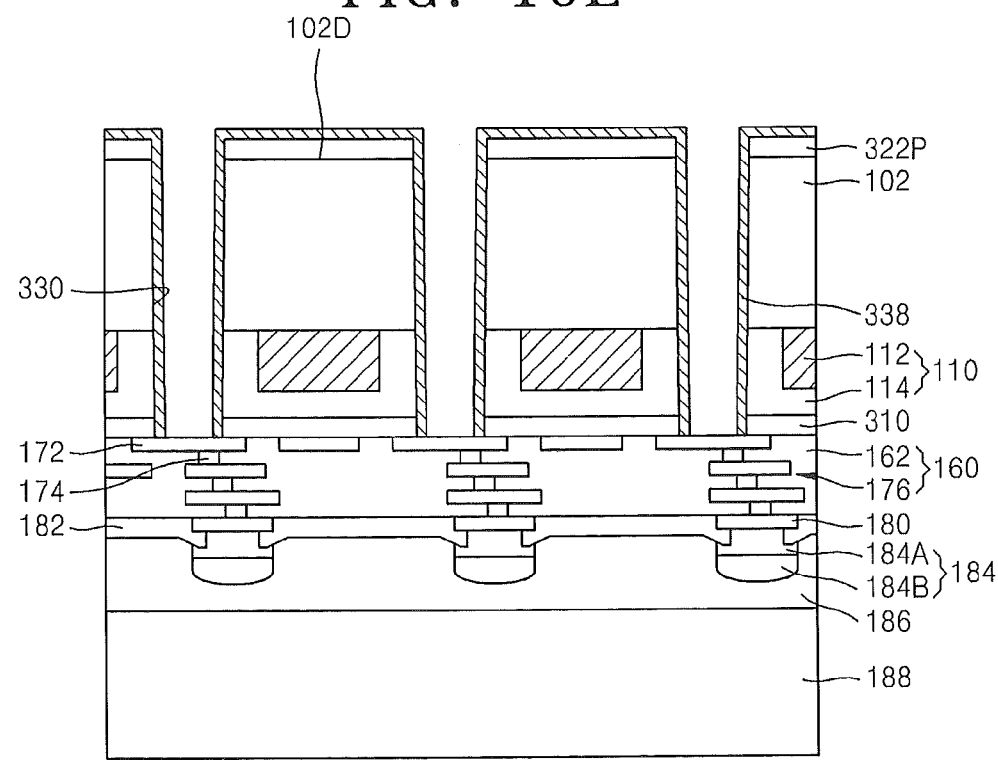

Referring to FIG. 10E, a plurality of insulating layers 338 are formed to cover inner side walls of the via holes 330.

In some embodiments, in order to form the insulating layers 338, an insulating layer may be formed by using a CVD process so as to cover the inner side walls of the via holes 330 and the backside 102D of the substrate 102, and portions of the insulating layer may be removed by using an anisotropic ion etching process so as to expose the metal wiring layers 172 in the via holes 330. In some embodiments, the insulating layers 338 may be formed as oxide layers, nitride layers, carbide layers, or a combination thereof. The insulating layers 338 may have a thickness of about 1500 to 2500 Å.

Figure 10F:
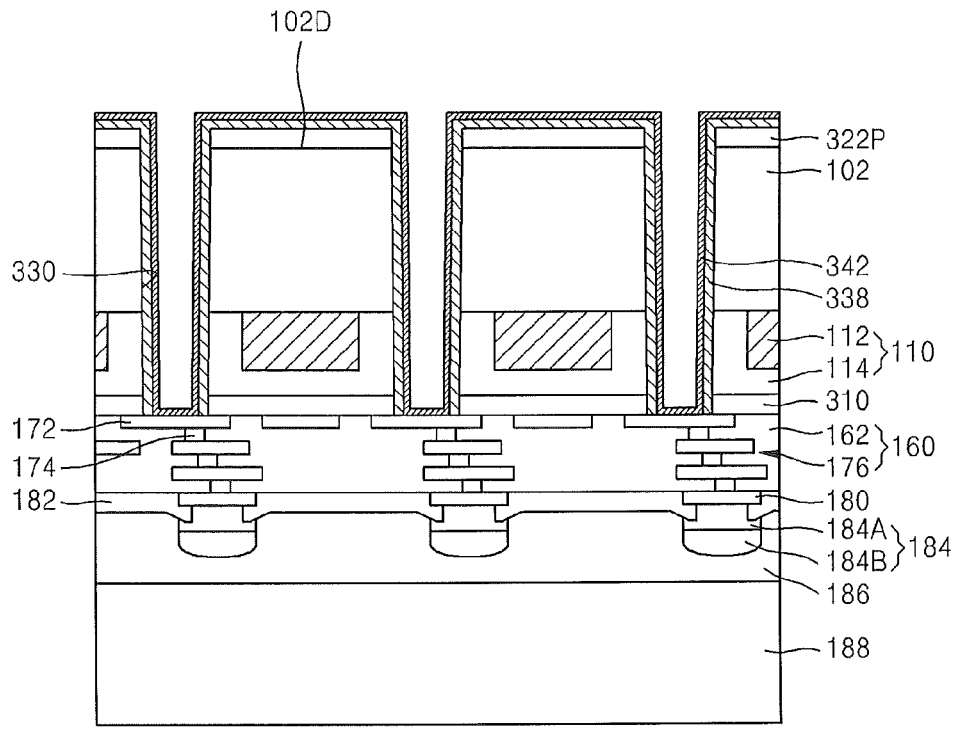

Referring to FIG. 10F, a barrier layer 342 is formed in the via holes 330.

The barrier layer 342 covers the insulating layers 338 and the metal wiring layers 172 exposed in the via holes 330. The barrier layer 342 extends on the insulating layers 338 to the outside of the via holes 330 in FIG. 10F. However, the inventive concept is not limited thereto. In some embodiments, the barrier layer 342 may be formed only in the via holes 330.

The barrier layer 342 is similar to the barrier layer 142 illustrated in FIG. 4D.

Figure 10G:
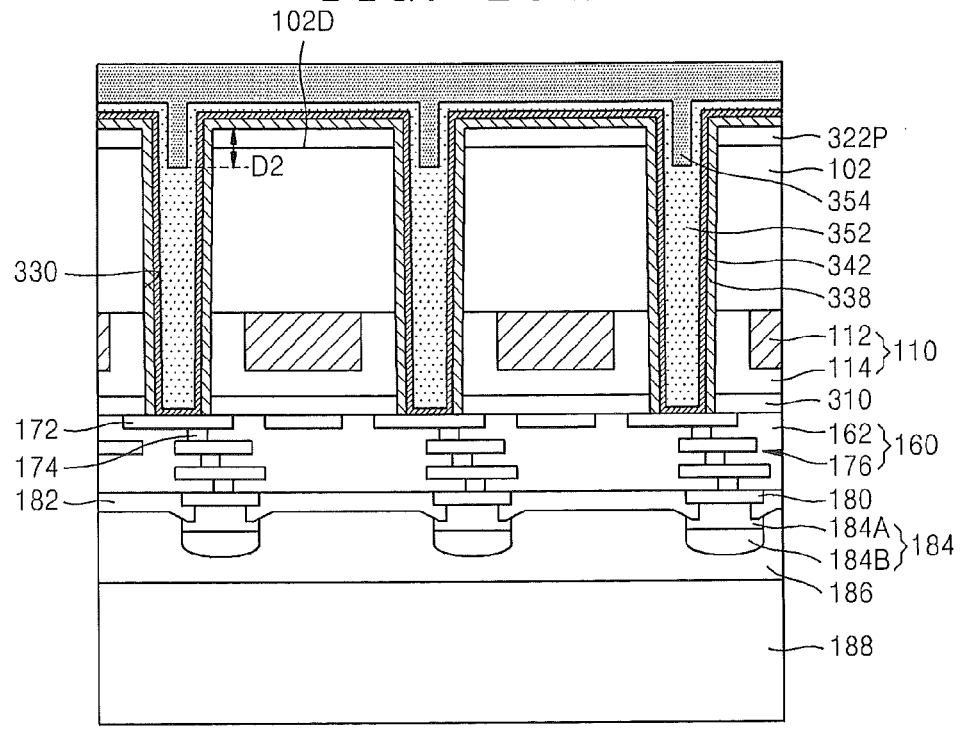

Referring to FIG. 10G, first and second conductive layers 352 and 354 are formed by using the method of forming the first and second conductive layers 152 and 154 described above in relation to FIGS. 4E through 4G.

The first conductive layer 352 may be formed until upper spaces from entrances of the via holes 130 have a depth D2 of several to several ten µm, e.g., about 1 to 10 µm. The second conductive layer 354 is formed on the first conductive layer 352 to fill the upper spaces of the via holes 330 near the entrances of the via holes 330.

The first and second conductive layers 352 and 354 are similar to the first and second conductive layers 152 and 154 respectively illustrated in FIGS. 4F and 4G.

Figure 10H:
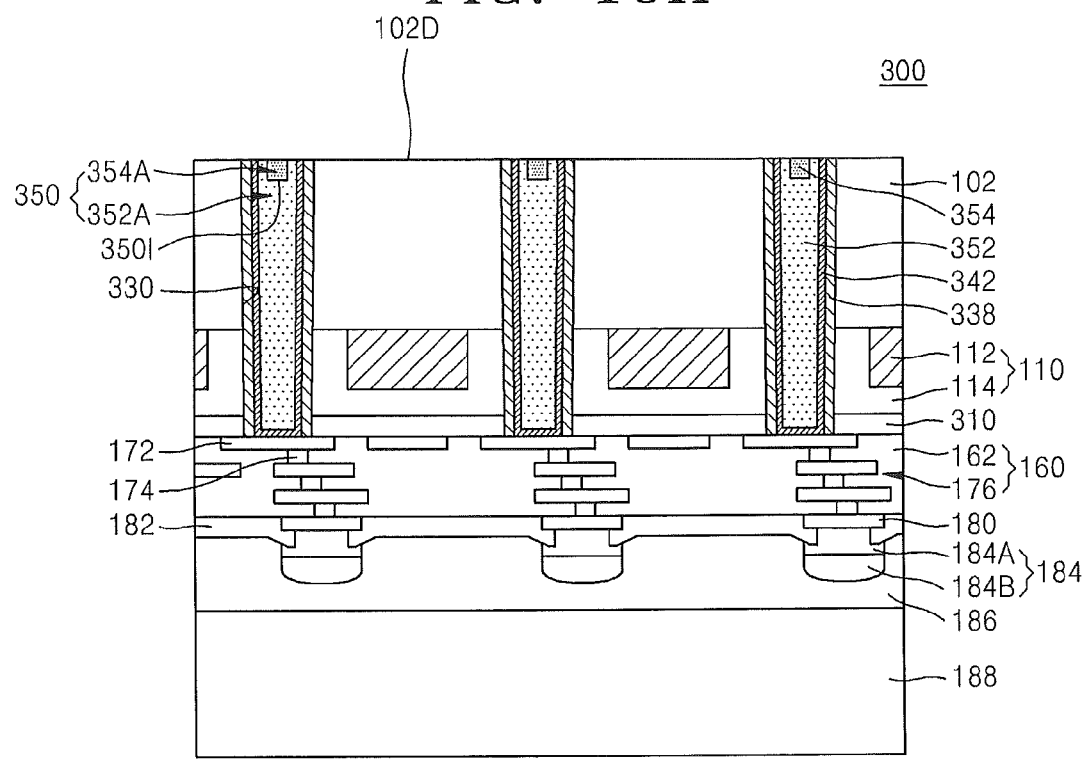

Referring to FIG. 10H, the structure including the second conductive layer 354 is polished by using a CMP process based on a method similar to the method described above in relation to FIG. 4H until the backside 102D of the substrate 102 is exposed. As such, the first and second conductive layers 352 and 354 remain only in the via holes 330.

The first and second conductive layers 352 and 354 remaining in the via holes 330 respectively form first and second through electrode units 352A and 354A of a TSV structure 350. The TSV structure 350, including the first and second through electrode units 352A and 354A, is the same as the TSV structure 150, including the first and second through electrode units 152A and 154A, illustrated in FIG. 4H.

The second through electrode unit 354A contains impurities at a higher content in comparison to the first through electrode unit 352A, and metal grains for forming the second through electrode unit 354A have an average grain size less than that of the metal grains for forming the first through electrode unit 352A. The second through electrode unit 354A may include a large number of stress relaxation components, e.g., growing of grains and forming of sub-microvoids, when a thermal budget is applied in a subsequent process, and thus local extrusion of the TSV structure 350 may be prevented.

In the integrated circuit device 300, the barrier layer 342 surrounds the first and second through electrode units 352A and 354A. A side wall of the first through electrode unit 352A includes a portion surrounded by the substrate 102, a portion surrounded by the interlayer insulating layer 114, and a portion surrounded by the etching stopper 310. The second through electrode unit 354A has a side wall surrounded by the substrate 102. An interface 3501 between the first and second through electrode units 352A and 354A exists at a portion of the TSV structure 350 surrounded by the substrate 102.

Figure 11:
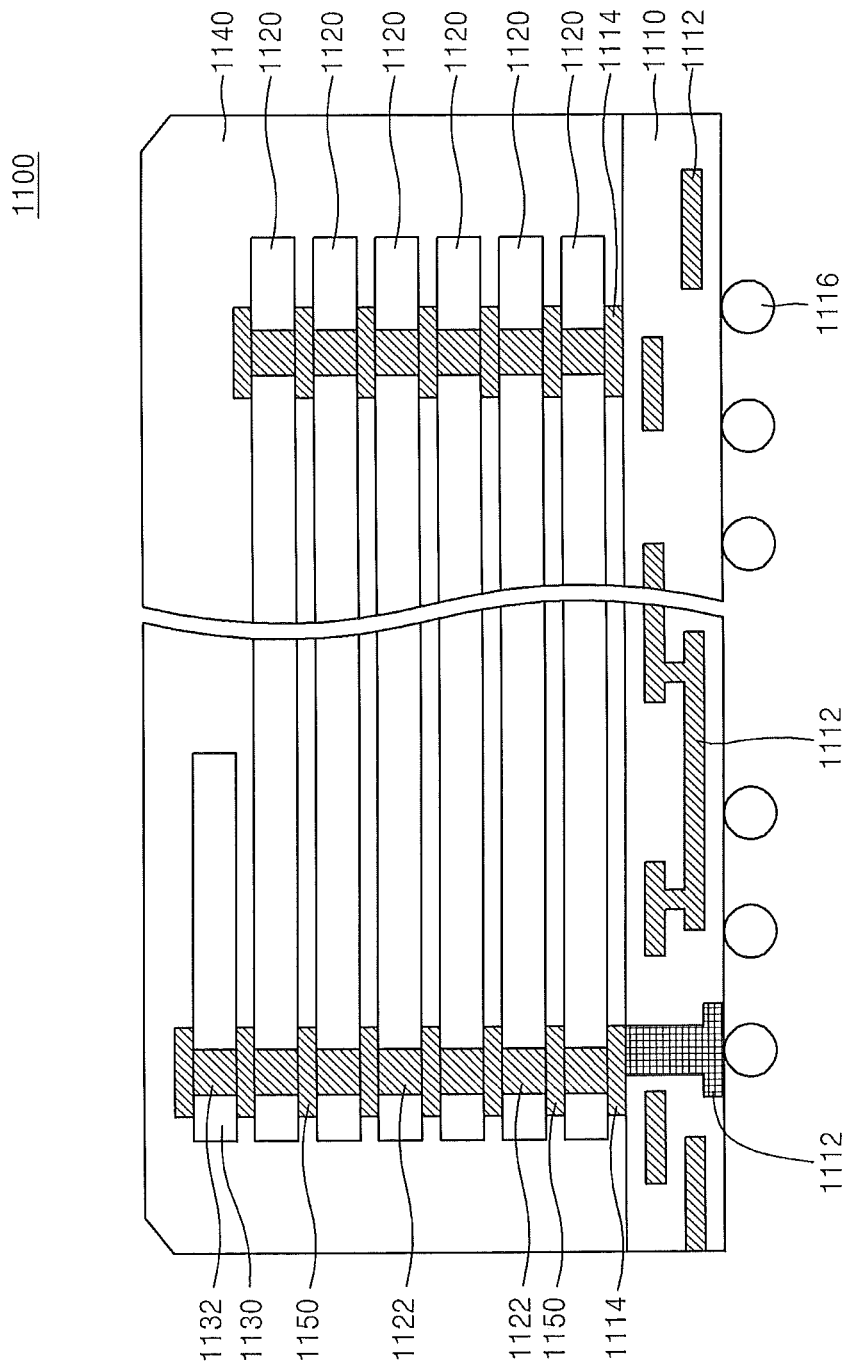
FIG. 11 is a cross-sectional view of a main portion of an integrated circuit device, according to some embodiments of the inventive concept.

FIG. 11 is a cross-sectional view of a main portion of an integrated circuit device 1100, according to some embodiments of the inventive concept.

Referring to FIG. 11, the integrated circuit device 1100 includes a plurality of semiconductor chips 1120 sequentially stacked on a package substrate 1110. A control chip 1130 is connected onto the semiconductor chips 1120. The stacked structure of the semiconductor chips 1120 and the control chip 1130 is sealed on the package substrate 1110 with an encapsulant 1140 such as a thermosetting resin. Although six semiconductor chips 1120 are vertically stacked in FIG. 11, the number of and the direction of stacking the semiconductor chips 1120 are not limited thereto. The number of semiconductor chips 1120 may be greater or less than six. The semiconductor chips 1120 may be mounted on the package substrate 1110 in a horizontal direction, or in vertical and horizontal directions. In some embodiments, the control chip 1130 may be omitted.

The package substrate 1110 may be formed as a flexible printed circuit board (FPCB), a rigid printed circuit board (RPCB), or a combination thereof. The package substrate 1110 includes inner wirings 1112 and connection terminals 1114. The connection terminals 1114 may be formed on a surface of the package substrate 1110. Solder balls 1116 are formed on another surface of the package substrate 1110. The connection terminals 1114 are electrically connected to the solder balls 1116 by the inner wirings 1112.

In some embodiments, the solder balls 1116 may be replaced by conductive bumps or a lead grid array (LGA).

At least one of the semiconductor chips 1120 and the control chip 1130 includes at least one of the integrated circuit devices 10A, 10B, 100, 200, and 300 illustrated in FIGS. 1A through 10H. In particular, each of the semiconductor chips 1120 and the control chip 1130 includes TSV structures 1122 and 1132. At least one of the TSV structures 1122 and 1132 includes at least one of the TSV structures 30, 30E, 150, 250, and 350 illustrated in FIGS. 1A through 10H.

The TSV structures 1122 and 1132 of each of the semiconductor chips 1120 and the control chip 1130 may be electrically connected to the connection terminals 1114 of the package substrate 1110 by a connection member 1150 such as bumps.

Each of the semiconductor chips 1120 may include a system large scale integration (LSI), flash memory, dynamic random access memory (DRAM), static random access memory (SRAM), electrically erasable programmable read-only memory (EEPROM), phase-change random access memory (PRAM), magnetic random access memory (MRAM), or resistive random access memory (RRAM). The control chip 1130 may include logic circuits such as serializer/deserializer (SER/DES) circuits.

Figure 12:
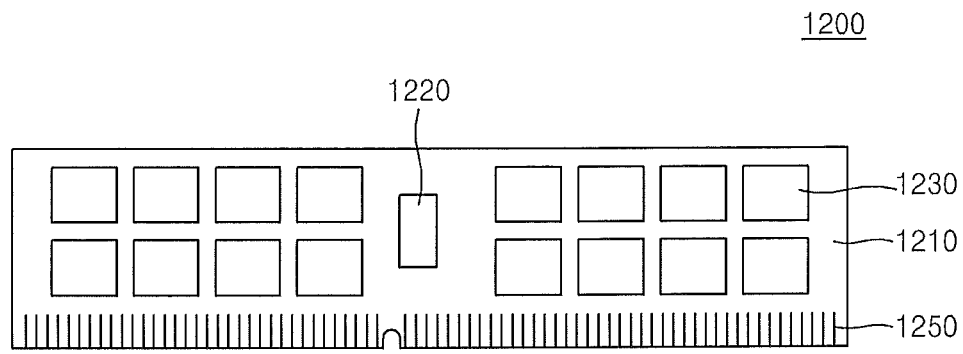
FIG. 12 is a plan view of a main portion of an integrated circuit device, according to some embodiments of the inventive concept.

FIG. 12 is a plan view of a main portion of an integrated circuit device 1200, according to some embodiments of the inventive concept.

The integrated circuit device 1200 includes a module substrate 1210, and a control chip 1220 and a plurality of semiconductor packages 1230 mounted on the module substrate 1210. A plurality of input/output (I/O) terminals 1250 are formed on the module substrate 1210.

Each of the semiconductor packages 1230 includes at least one of the integrated circuit devices 10A, 10B, 100, 200, 300, and 1110 illustrated in FIGS. 1A through 11. In particular, each of the semiconductor packages 1230 includes at least one of the TSV structures 30, 30E, 150, 250, and 350 illustrated in FIGS. 1A through 10H.

Figure 13:
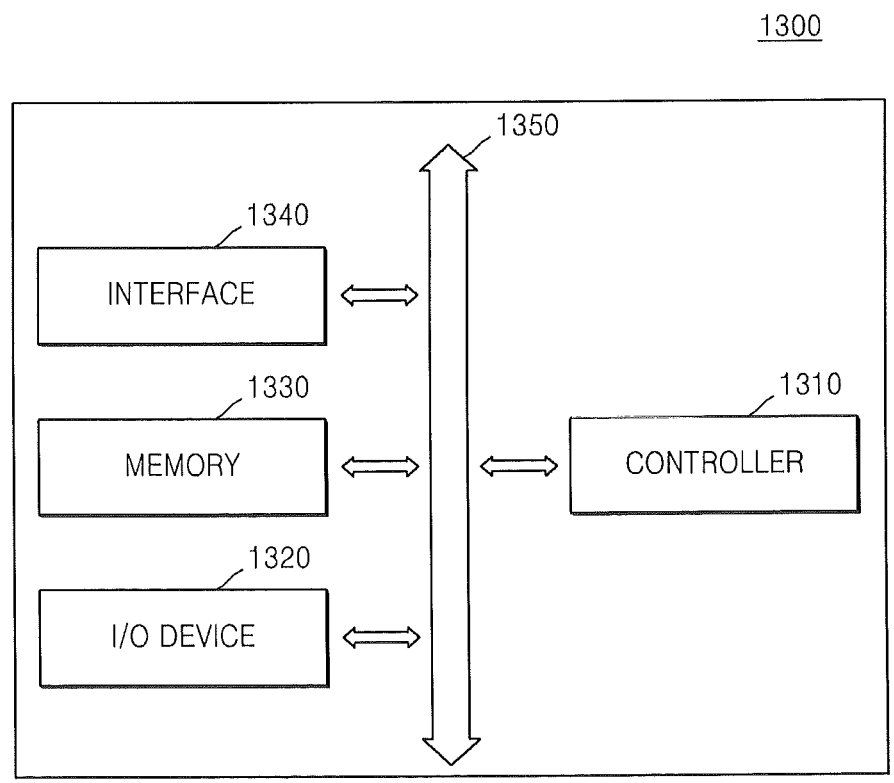
FIG. 13 is a block diagram of a main portion of an integrated circuit device, according to some embodiments of the inventive concept.

FIG. 13 is a block diagram of a main portion of an integrated circuit device 1300, according to some embodiments of the inventive concept.

The integrated circuit device 1300 includes a controller 1310, an I/O device 1320, a memory 1330, and an interface 1340. The integrated circuit device 1300 may be a mobile system or a system for transmitting or receiving data. In some embodiments, the mobile system is at least one of a personal digital assistant (PDA), a portable computer, a web tablet, a wireless phone, a mobile phone, a digital music player, and a memory card.

In some embodiments, the controller 1310 is a microprocessor, a digital signal processor, or a microcontroller.

The I/O device 1320 is used to input or output data to or from the integrated circuit device 1300. The integrated circuit device 1300 may be connected to an external apparatus, e.g., a personal computer (PC) or a network, and may exchange data with the external apparatus by using the I/O device 1320. In some embodiments, the I/O device 1320 is a keypad, a keyboard, or a display device.

In some embodiments, the memory 1330 stores codes and/or data for operating the controller 1310. In some embodiments, the memory 1330 stores data processed by the controller 1310. At least one of the controller 1310 and the memory 1330 includes at least one of the integrated circuit devices 10A, 10B, 100, 200, 300, 1100, and 1200 illustrated in FIGS. 1A through 12. In particular, at least one of the controller 1310 and the memory 1330 may be formed as an electronic system including at least one of the TSV structures 30, 30E, 150, 250, and 350 illustrated in FIGS. 1A through 10H.

The interface 1340 functions as a data transmission path between the integrated circuit device 1300 and an external apparatus. The controller 1310, the I/O device 1320, the memory 1330, and the interface 1340 may communicate with each other via a bus 1350.

The integrated circuit device 1300 may be included in a mobile phone, an MP3 player, a navigation system, a portable multimedia player (PMP), a solid state disk (SSD), or household appliances.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device, comprising:
   a semiconductor structure; and
   a through-silicon-via (TSV) metal electrode penetrating through the semiconductor structure and comprising a lower end and a upper end,
   wherein the TSV metal electrode comprises:
   a first portion that extends from the lower end to the upper end of the TSV metal electrode, the first portion including a recess in a central portion of the upper end of the TSV metal electrode and including impurities of a first concentration; and
   a second portion that is in the recess of the first portion and includes impurities of a second concentration greater than the first concentration.

2. The integrated circuit device of claim 1, wherein the second concentration is at least ten times greater than the first concentration.

3. The integrated circuit device of claim 1, wherein the second portion of the TSV metal electrode comprises a number of sub-microvoids or twin boundaries greater than a number of sub-microvoids or twin boundaries that are included in the first portion of the TSV metal electrode.

4. The integrated circuit device of claim 1, wherein the first portion of the TSV metal electrode comprises a first metal layer having a first average grain size, and
   wherein the second portion of the TSV metal electrode comprises a second metal layer having a second average grain size less than the first average grain size.

5. The integrated circuit device of claim 1, wherein each of the first and second portions of the TSV metal electrode comprises at least one impurity of carbon (C), oxygen (O), nitrogen (N), sulfur (S) and a halogen group element.

6. The integrated circuit device of claim 1, wherein the second portion of the TSV metal electrode comprises impurities comprising an amino or aromatic functional group.

7. The integrated circuit device of claim 1, wherein the semiconductor structure comprises:
   a substrate; and
   an interlayer insulating layer on the substrate,
   wherein a sidewall of the first portion of the TSV metal electrode is surrounded by the substrate, and
   wherein the second portion of the TSV metal electrode extends through the interlayer insulating layer.

8. The integrated circuit device of claim 7, wherein an interface between the first and second portions of the TSV metal electrode is between an upper surface and a lower surface of the interlayer insulating layer.

9. The integrated circuit device of claim 1, wherein the semiconductor structure comprises:
   a substrate; and
   an interlayer insulating layer on the substrate,
   wherein the first portion of the TSV metal electrode extends through the interlayer insulating layer, and
   wherein a sidewall of the second portion of the TSV metal electrode is surrounded by the substrate.

10. The integrated circuit device of claim 9, wherein an interface between the first and second portions of the TSV metal electrode is between an upper surface and a lower surface of the substrate.

11. The integrated circuit device of claim 1, wherein the semiconductor structure comprises:
    a substrate;
    an interlayer insulating layer on the substrate; and
    an inter-metal-layer insulating layer on the interlayer insulating layer,
    wherein the TSV metal electrode penetrates through the substrate, the interlayer insulating layer, and the inter-metal-layer insulating layer.

12. The integrated circuit device of claim 11, wherein a sidewall of the first portion of the TSV metal electrode is surrounded by the substrate and the interlayer insulating layer, and
    wherein a sidewall of the second portion of the TSV metal electrode is surrounded by the inter-metal-layer insulating layer.

13. The integrated circuit device of claim 11, wherein an interface between the first and second portions of the TSV metal electrode is between an upper surface and a lower surface of the inter-metal-layer insulating layer.

14. The integrated circuit device of claim 1, wherein the first concentration is about 0.001 to 10ppm, and the second concentration is about 1 to 10,000ppm.

15. The integrated circuit device of claim 1, wherein a cross-sectional area of the first portion of the TSV metal electrode is greater than a cross-sectional area of the second portion of the TSV metal electrode.

16. The integrated circuit device of claim 15, wherein the first portion of the TSV metal electrode surrounds and contacts a sidewall of the second portion of the TSV metal electrode.

17. The integrated circuit device of claim 4, wherein a ratio of the first average grain size to the second average grain size is in a range of about 1.5 to about 10.

18. The integrated circuit device of claim 17, wherein the second average grain size is equal to or less than about 100 nm.

19. The device of claim 18, wherein the first average grain size is in a range of about 100 nm to about 3 μm.

20. An integrated circuit device, comprising:
a substrate;
a via hole penetrating through the substrate; and
a metal via electrode in the via hole, wherein the metal via electrode comprises a first electrode and a second electrode with a boundary therebetween and a first average grain size of a first conductive material comprising the first electrode is greater than a second average grain size of a second conductive material comprising the second electrode, and the second average grain size is equal to or less than about 100 nm,
wherein the metal via electrode comprises a first surface and a second surface that is opposite the first surface, and
wherein the first electrode extends from the first surface to the second surface of the metal via electrode and comprises a recess in a center portion of the second surface of the metal via electrode, and the second electrode is in the recess of the first electrode.

21. The device of claim 20, wherein the first electrode comprises the first surface of the metal via electrode and the second electrode comprises the second surface of the metal via electrode.

22. The device of claim 20, wherein the first average grain size is in range of about 100 nm to about 3 μm.

23. The device of claim 20, wherein a ratio of the first average grain size to the second average grain size is in range of about 1.5 to about 10.

24. The device of claim 20, wherein the first conductive material includes first impurities of a first concentration and the second conductive material includes second impurities of a second concentration greater than the first concentration.

25. The device of claim 24, wherein the second concentration is at least ten times greater than the first concentration.

26. The device of claim 24, wherein the second impurities comprises amino or aromatic functional group.

27. The device of claim 20, wherein a cross-sectional area of the first electrode is greater than a cross-sectional area of the second electrode.

28. The device of claim 27, wherein a height of the second electrode when viewed in cross section is in range of about 1 μm to about 10 μm.

29. The device of claim 20, wherein the first electrode contacts a sidewall of the second electrode.

30. The device of claim 24, wherein the first concentration is about 0.001 to 10ppm, and the second concentration is about 1 to 10,000ppm.

* * * * *